United States Patent
Gonzalez

(10) Patent No.: US 7,202,519 B2
(45) Date of Patent: Apr. 10, 2007

(54) MEMORY CELLS HAVING AN ACCESS TRANSISTOR WITH A SOURCE/DRAIN REGION COUPLED TO A CAPACITOR THROUGH AN EXTENSION

(75) Inventor: Fernando Gonzalez, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 352 days.

(21) Appl. No.: 10/870,811

(22) Filed: Jun. 17, 2004

(65) Prior Publication Data

US 2004/0222453 A1 Nov. 11, 2004

Related U.S. Application Data

(60) Continuation of application No. 10/372,051, filed on Feb. 21, 2003, now Pat. No. 6,774,422, which is a division of application No. 09/795,548, filed on Feb. 28, 2001, now Pat. No. 6,706,608.

(51) Int. Cl.
    H01L 27/108  (2006.01)
    H01L 29/76   (2006.01)
    H01L 29/94   (2006.01)
    H01L 31/119  (2006.01)

(52) U.S. Cl. ............... 257/303; 257/304; 257/306; 257/E27.087

(58) Field of Classification Search ............ 257/303, 257/304, 306, E27.087
    See application file for complete search history.

(56) References Cited

U.S. PATENT DOCUMENTS

| | | | |
|---|---|---|---|
| 4,896,197 A * | 1/1990 | Mashiko | 257/303 |
| 5,089,869 A * | 2/1992 | Matsuo et al. | 257/303 |
| 5,108,943 A * | 4/1992 | Sandhu et al. | 438/254 |
| 5,138,412 A * | 8/1992 | Hieda et al. | 257/296 |
| 5,315,141 A | 5/1994 | Kim | |
| 5,336,912 A | 8/1994 | Ohtsuki | |
| 5,374,564 A | 12/1994 | Bruel | |
| 5,631,186 A | 5/1997 | Park et al. | |
| 5,874,757 A * | 2/1999 | Chao | 257/303 |
| 5,888,854 A | 3/1999 | Morihara | |
| 5,939,745 A | 8/1999 | Park et al. | |
| 5,968,840 A | 10/1999 | Park et al. | |
| 5,985,742 A | 11/1999 | Henley et al. | |
| 6,027,988 A | 2/2000 | Cheung et al. | |
| 6,033,974 A | 3/2000 | Henley et al. | |
| 6,048,411 A | 4/2000 | Henley et al. | |
| 6,072,208 A | 6/2000 | Nishihara | |
| 6,159,824 A | 12/2000 | Henley et al. | |
| 2003/0116798 A1 | 6/2003 | Park | |

* cited by examiner

*Primary Examiner*—Ngân V. Ngô
(74) *Attorney, Agent, or Firm*—Leffert Jay & Polglaze, PA

(57) ABSTRACT

Fabrication of memory cell capacitors in an over/under configuration facilitates increased capacitance values for a given die area. A pair of memory cells sharing a bit-line contact include a first capacitor below the substrate surface. The pair of memory cells further include a second capacitor such that at least a portion of the second capacitor is underlying the first capacitor. Such memory cell capacitors can thus have increased surface area for a given capacitor height versus memory cell capacitors formed strictly laterally adjacent one another. The memory cell capacitors can be fabricated using silicon-on-insulator (SOI) techniques. The memory cell capacitors are useful for a variety of memory arrays, memory devices and electronic systems.

32 Claims, 29 Drawing Sheets

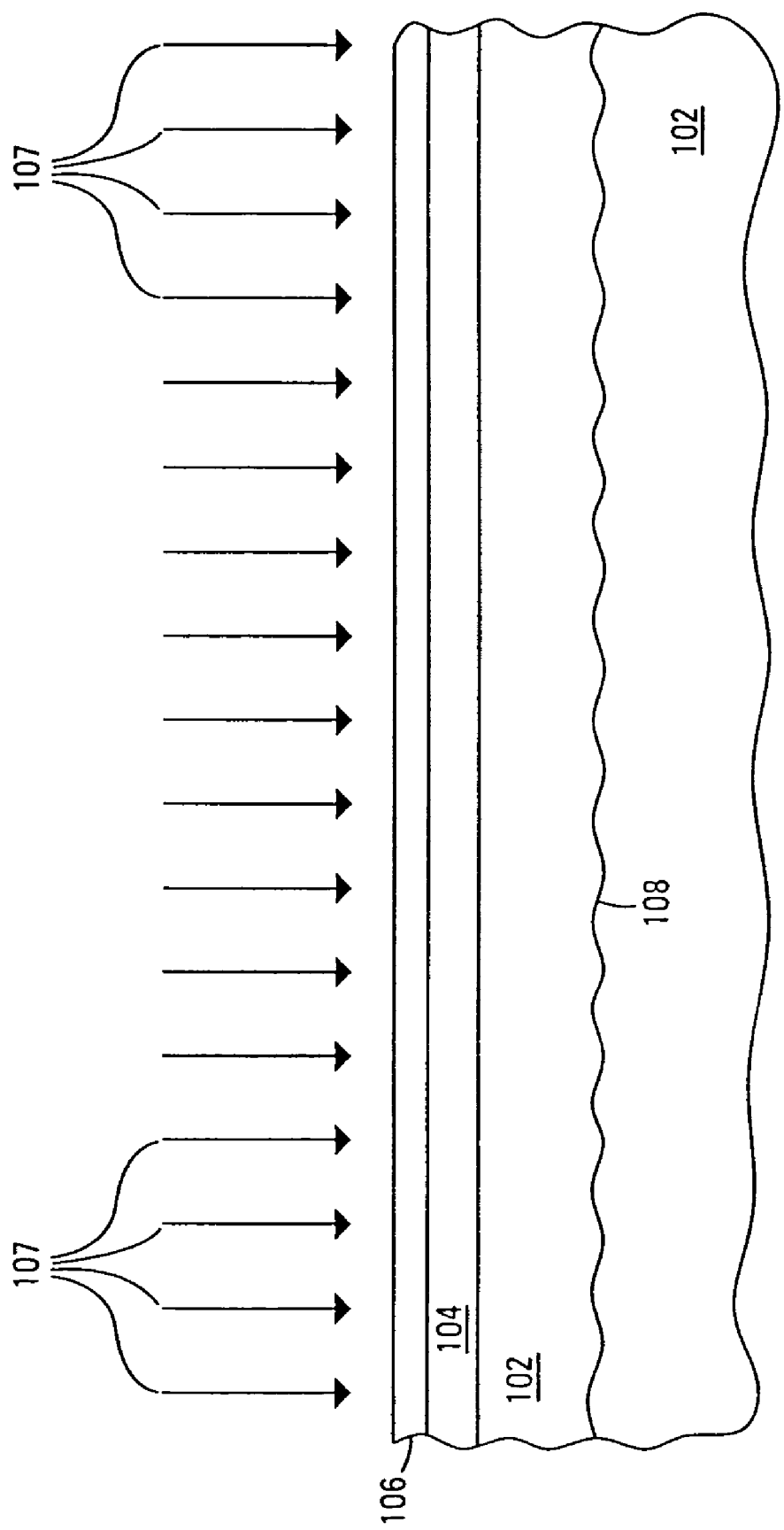

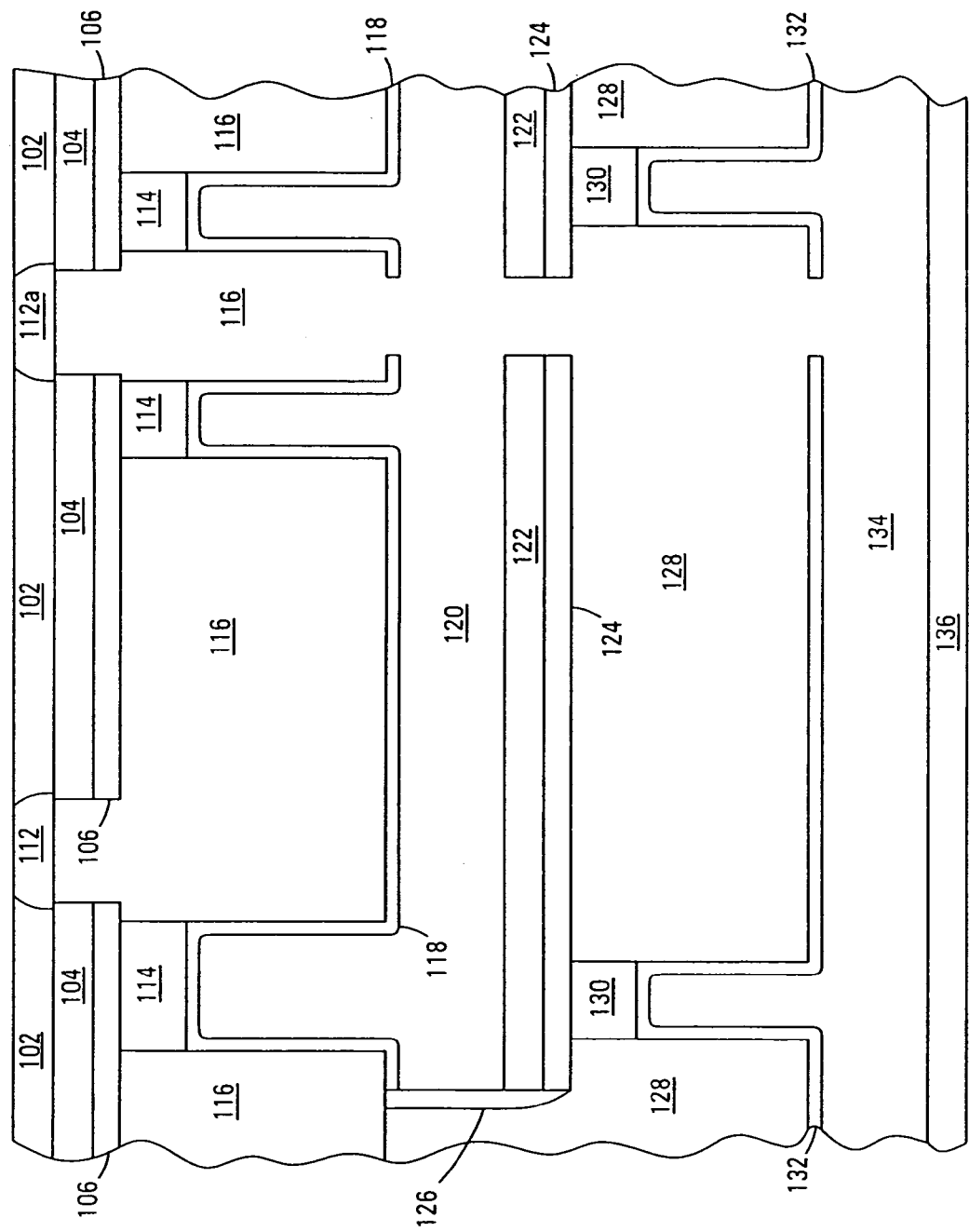

MEMORY CELLS HAVING AN ACCESS TRANSISTOR WITH A SOURCE/DRAIN REGION COUPLED TO A CAPACITOR THROUGH AN EXTENSION

RELATED APPLICATIONS

This application is a continuation of U.S. patent application Ser. No. 10/372,051, filed Feb. 21, 2003, now U.S. Pat. No. 6,774,422, which application is a divisional of U.S. patent application Ser. No. 09/795,548, filed Feb. 28, 2001 (now U.S. Pat. No. 6,706,608) and of the same title, which applications are commonly assigned and incorporated by reference in their entirety herein.

TECHNICAL FIELD OF THE INVENTION

The present invention relates generally to integrated circuit memory devices, and in particular to the development of Dynamic Random Access Memory (DRAM) devices having multiple capacitors utilizing the same die area.

BACKGROUND OF THE INVENTION

Electronic information handling or computer systems, whether large machines, microcomputers or small and simple digital processing devices, require memory for storing data and program instructions. Various memory systems have been developed over the years to address the evolving needs of information handling systems. One such memory system includes integrated circuit memory devices.

Integrated circuit memory devices are rapidly-accessible memory devices. In an integrated circuit memory device, the time required for storing and retrieving information generally is independent of the physical location of the information within the memory device. Semiconductor memory devices typically store information in a large array of cells.

Computer, communication and industrial applications are driving the demand for memory devices in a variety of electronic systems. One important form of semiconductor memory device includes Dynamic Random Access Memory (DRAM). A typical DRAM includes an array of memory cells. Each memory cell includes a capacitor that stores the data in the cell and a transistor that controls access to the data. The charge stored across the capacitor is representative of a data bit.

Data can be either stored in the memory cells during a write mode, or data may be retrieved from the memory cells during a read mode. The data is transmitted on signal lines, referred to as bit lines, which are coupled to input/output (I/O) lines through transistors used as switching devices. Typically, for each bit of data stored, its true logic state is available on an I/O line and its complementary logic state is available on an I/O complement line.

The memory cells are typically arranged in an array and each cell has an address identifying its location in the array. The array includes a configuration of intersecting conductive lines, i.e., the bit lines and word lines. Memory cells are located at intersections of the bit lines and word lines. In order to read from or write to a cell, the particular cell in question must be selected, or addressed. The address for the selected cell is represented by input signals to an address decoder. In response to the decoded address, row access circuitry activates a word line. The selected word line activates the access transistors for each of the memory cells in communication with the selected word line. In response to the decoded column address, column access circuitry selects a bit line. For a read operation, the selected word line activates the access transistors for a given word line address, and data is latched to the selected bit line.

Designers are under constant pressure to increase memory cell density to reduce costs and increase performance. As memory cell density is increased, memory cell size is generally decreased. Available die area for the capacitor also generally decreases with decreasing memory cell size. As capacitance is proportional to capacitor surface area, decreasing the available die area makes it more difficult to maintain capacitance levels. While three-dimensional structures, enhanced surface area materials and high-k dielectric materials can be used to increase capacitance for a given die area, these techniques have practical limitations.

To read a memory cell of the type described herein, the charge stored on the capacitor is sensed and amplified. Sensing of the charge stored on the capacitor often involves sensing a differential between a reference node and a sensing node coupled to the capacitor. If the capacitance of the memory cell capacitor becomes too small, it may become difficult or impossible to sense this differential.

For the reasons stated above, and for other reasons stated below that will become apparent to those skilled in the art upon reading and understanding the present specification, there is a need in the art for alternative structures and processes for improving capacitance in memory devices.

SUMMARY

Fabrication of memory cell capacitors in an over/under configuration facilitates increased capacitance values for a given die area. A pair of memory cells sharing a bit-line contact include a first capacitor below the substrate surface. The pair of memory cells further include a second capacitor such that at least a portion of the second capacitor is underlying the first capacitor. Such memory cell capacitors can thus have increased surface area for a given capacitor height versus memory cell capacitors formed strictly laterally adjacent one another. The memory cell capacitors can be fabricated using silicon-on-insulator (SOI) techniques. The memory cell capacitors are useful for a variety of memory arrays, memory devices and electronic systems.

For one embodiment, the invention provides a memory cell. The memory cell includes an access transistor having a first source/drain region and a second source/drain region, wherein the second source/drain region is coupled to a bit line. The memory cell further includes a capacitor coupled to the first source/drain region of the access transistor. The capacitor is overlying at least a portion of a capacitor of a second memory cell, wherein the second memory cell has an access transistor having a source/drain region coupled to the bit line.

For another embodiment, the invention provides a memory cell. The memory cell includes an access transistor having a first source/drain region and a second source/drain region, wherein the second source/drain region is coupled to a bit line. The memory cell further includes a capacitor coupled to the first source/drain region of the access transistor through an extension. The extension is laterally adjacent a second capacitor of a second memory cell and the first capacitor is underlying at least a portion of the second capacitor.

For yet another embodiment, the invention provides a method of forming a pair of memory cells. The method includes forming a first insulative layer on the substrate, patterning the first insulative layer to define future first source/drain regions, and forming a pair of first source/drain regions in the substrate. The method further includes forming a first storage node coupled to a first one of the pair of first source/drain regions and forming an extension coupled to a second one of the pair of first source/drain regions, wherein the extension is isolated from the first storage node. The method still further includes forming a first cell dielectric layer overlying the first storage node and the extension, forming a first cell plate layer overlying the first cell dielectric layer, forming a second insulative layer overlying the first cell plate layer, and exposing a portion of the extension. The method still further includes forming a second storage node coupled to the exposed portion of the extension and isolated from the first storage node and the first cell plate layer, forming a second cell dielectric layer overlying the second storage node, forming a second cell plate layer overlying the second cell dielectric layer and forming a third insulative layer overlying the second cell plate layer. The method still further includes cleaving the substrate, thereby exposing a surface of the substrate, and planarizing the exposed surface of the substrate to expose the first source/drain regions. The method still further includes forming word lines overlying at least a portion of the pair of first source/drain regions and forming a second source/drain region in the substrate interposed between the word lines.

For a still further embodiment, the invention provides a method of forming capacitors for a pair of memory cells. The method includes forming a first insulative layer on a substrate, removing a portion of the first insulative layer to expose first and second portions of the substrate and forming a first capacitor overlying the first insulative layer and coupled to the first portion of the substrate, wherein the first capacitor includes a storage node, a cell dielectric layer and a cell plate layer. The method further includes forming a conductive extension coupled to the second portion of the substrate and isolated from the storage node of the first capacitor and forming a second capacitor overlying at least a portion of the first capacitor and coupled to the second portion of the substrate through the conductive extension, wherein the second capacitor includes a storage node, a cell dielectric layer and a cell plate layer.

Further embodiments of the invention include apparatus and methods of varying scope.

BRIEF DESCRIPTION OF THE DRAWINGS

FIGS. 2A–2F are cross-sectional views of fabrication of another portion of the memory array of FIGS. 1A–1U showing one embodiment of providing a potential node to the capacitor cell plates.

DETAILED DESCRIPTION

In the following detailed description of the present embodiments, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer or substrate used in the following description includes any base semiconductor structure. Examples include silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and the terms wafer and substrate include the underlying layers containing such regions/junctions. The following detailed description is, therefore, not to be taken in a limiting sense, and the scope of the present invention is defined only by the appended claims and equivalents thereof.

Figure 1B:
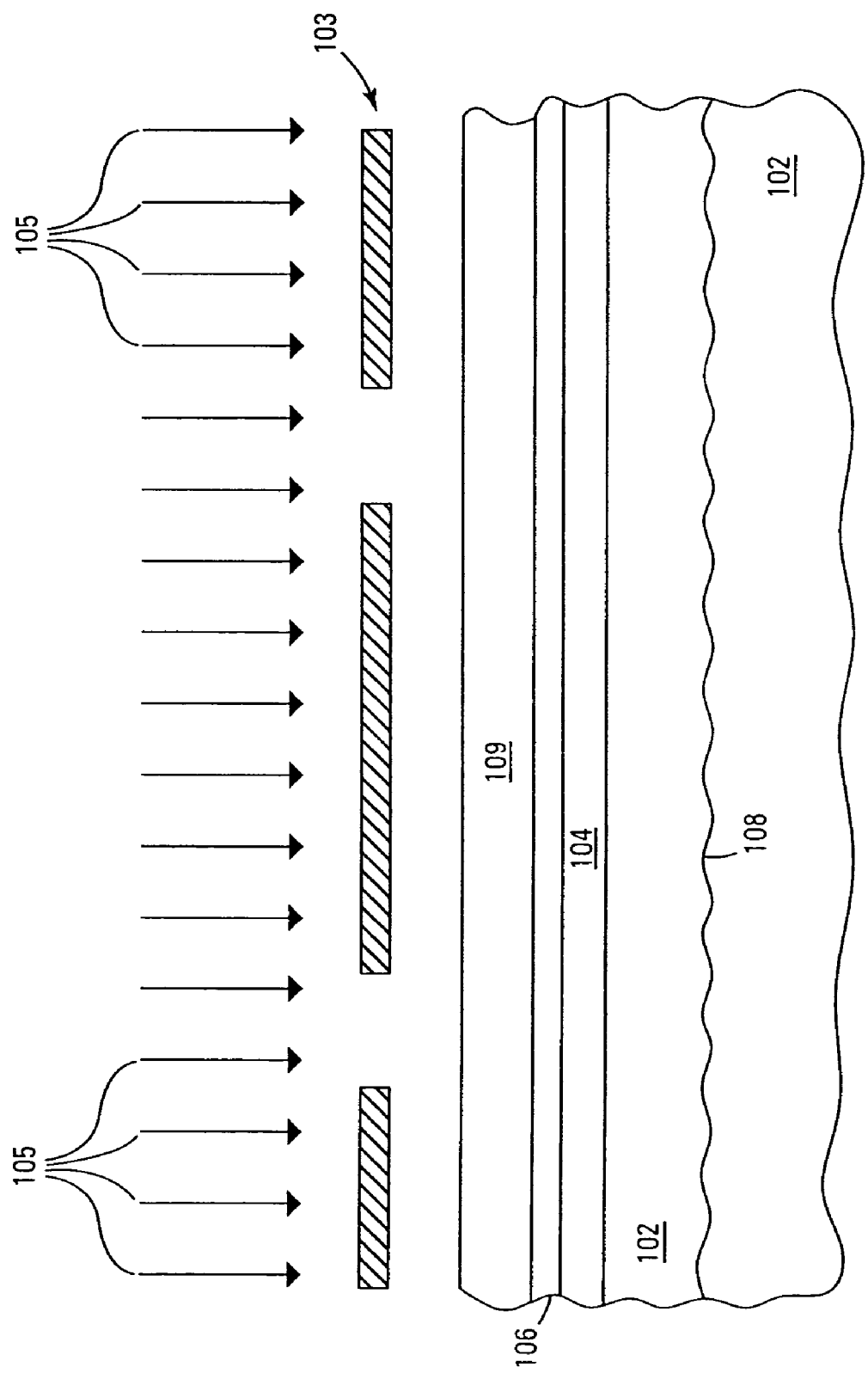
FIGS. 1A–1U are cross-sectional views of fabrication of a portion of a memory array in accordance with one embodiment of the invention during various fabrication stages.
Figure 1C:
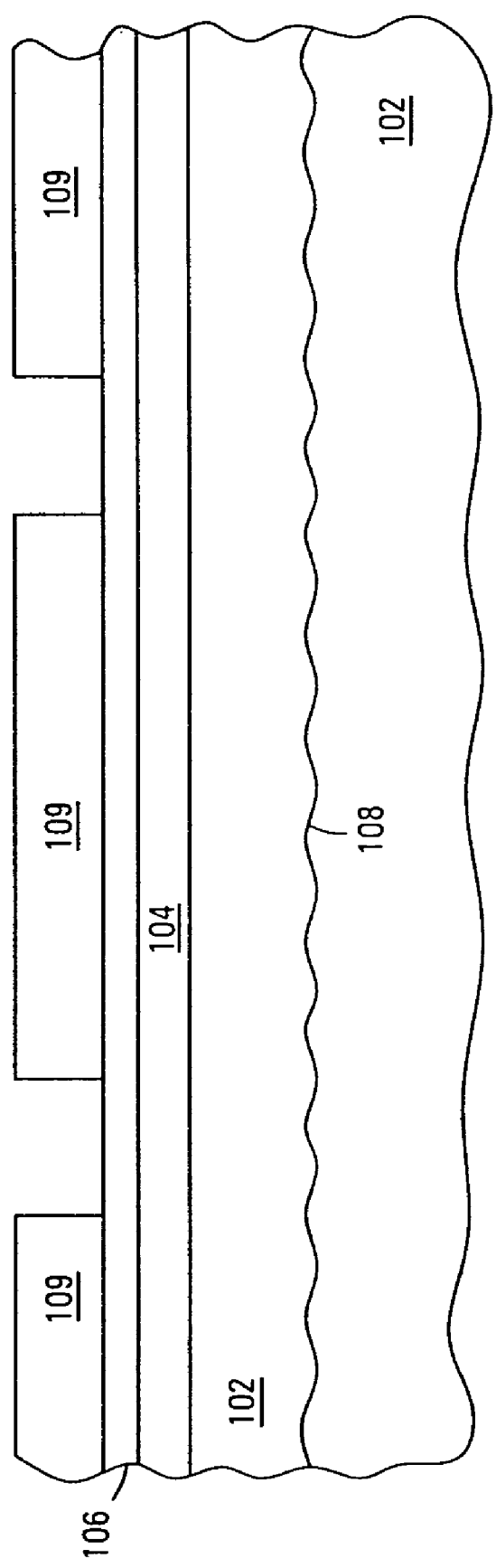
Figure 1D:
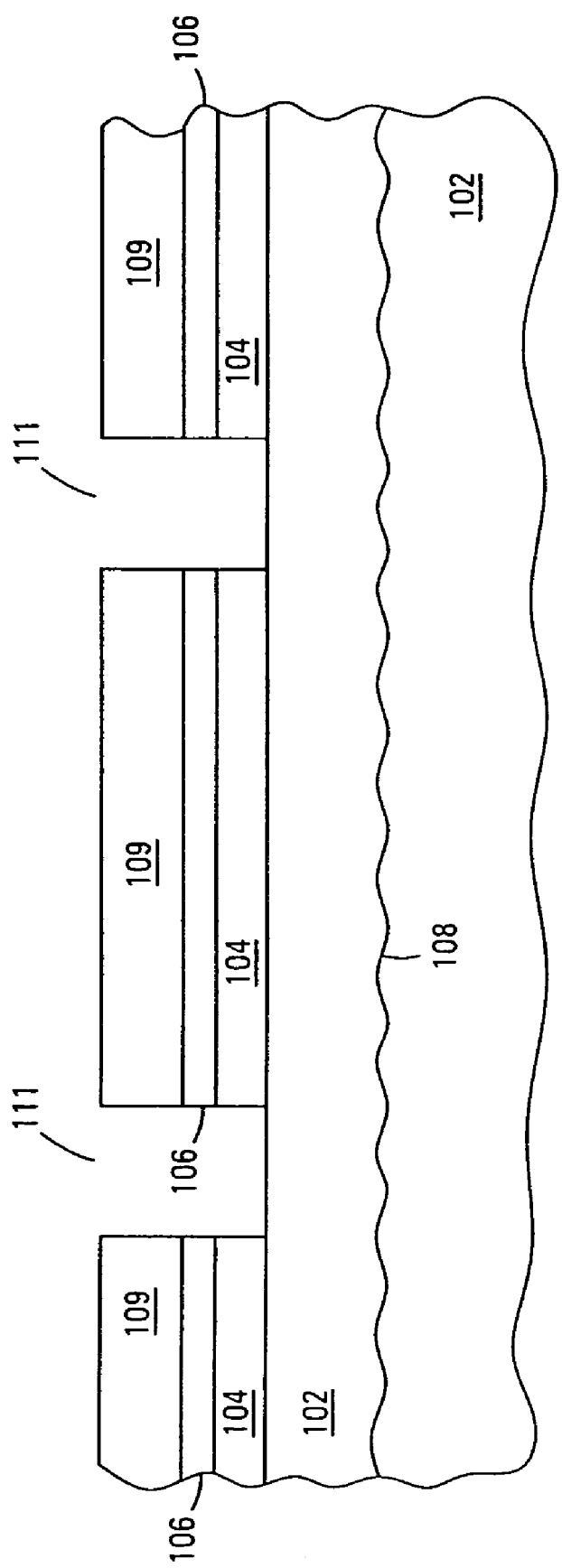
Figure 1E:
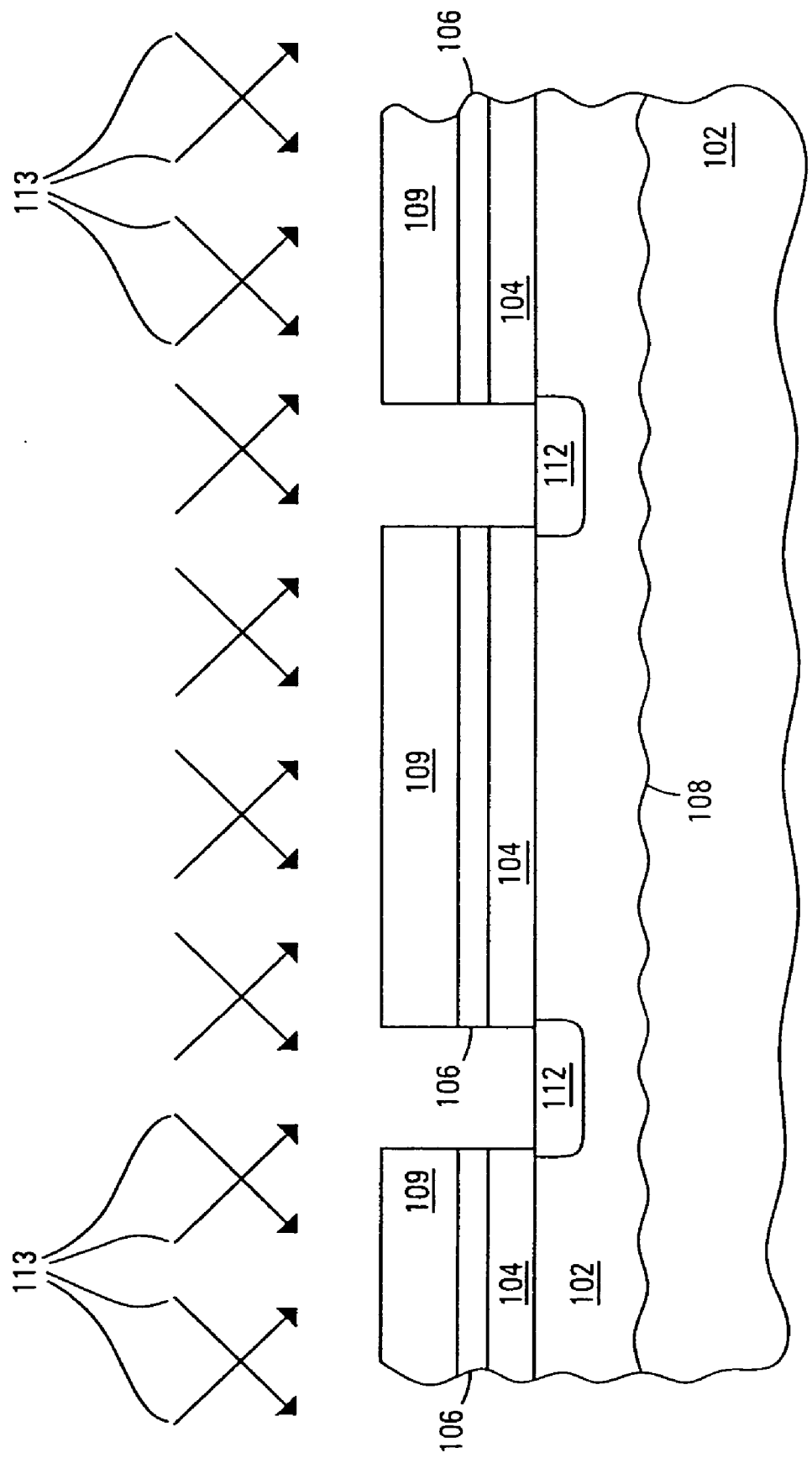
Figure 1F:
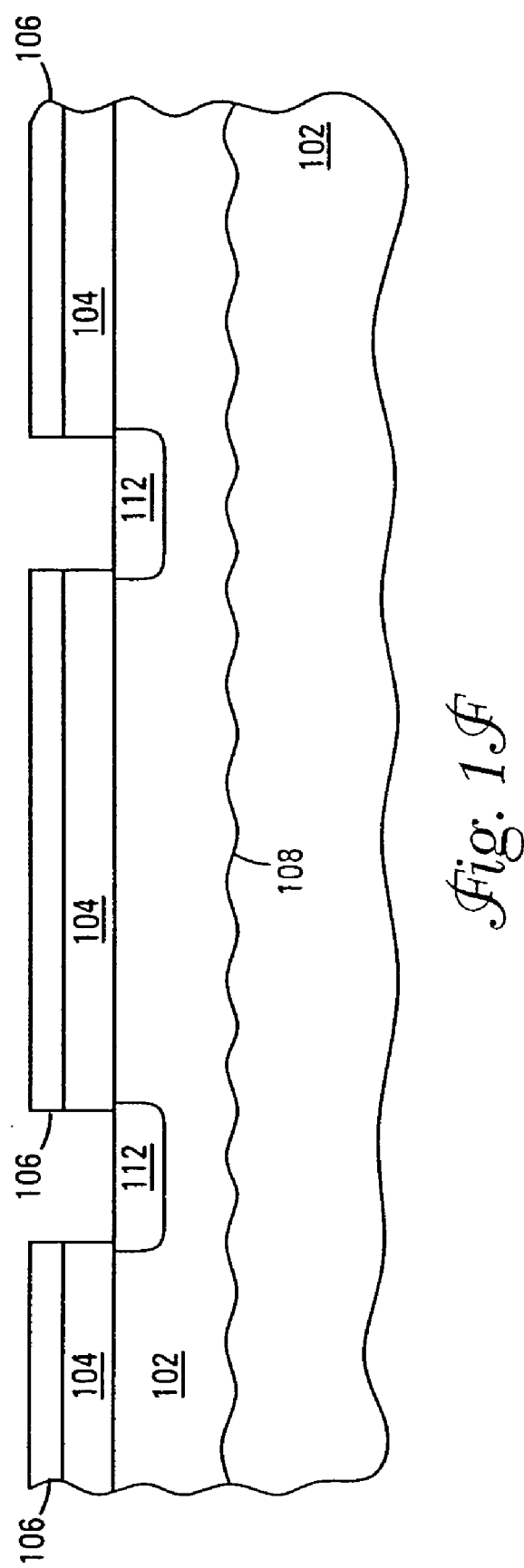
Figure 1G:
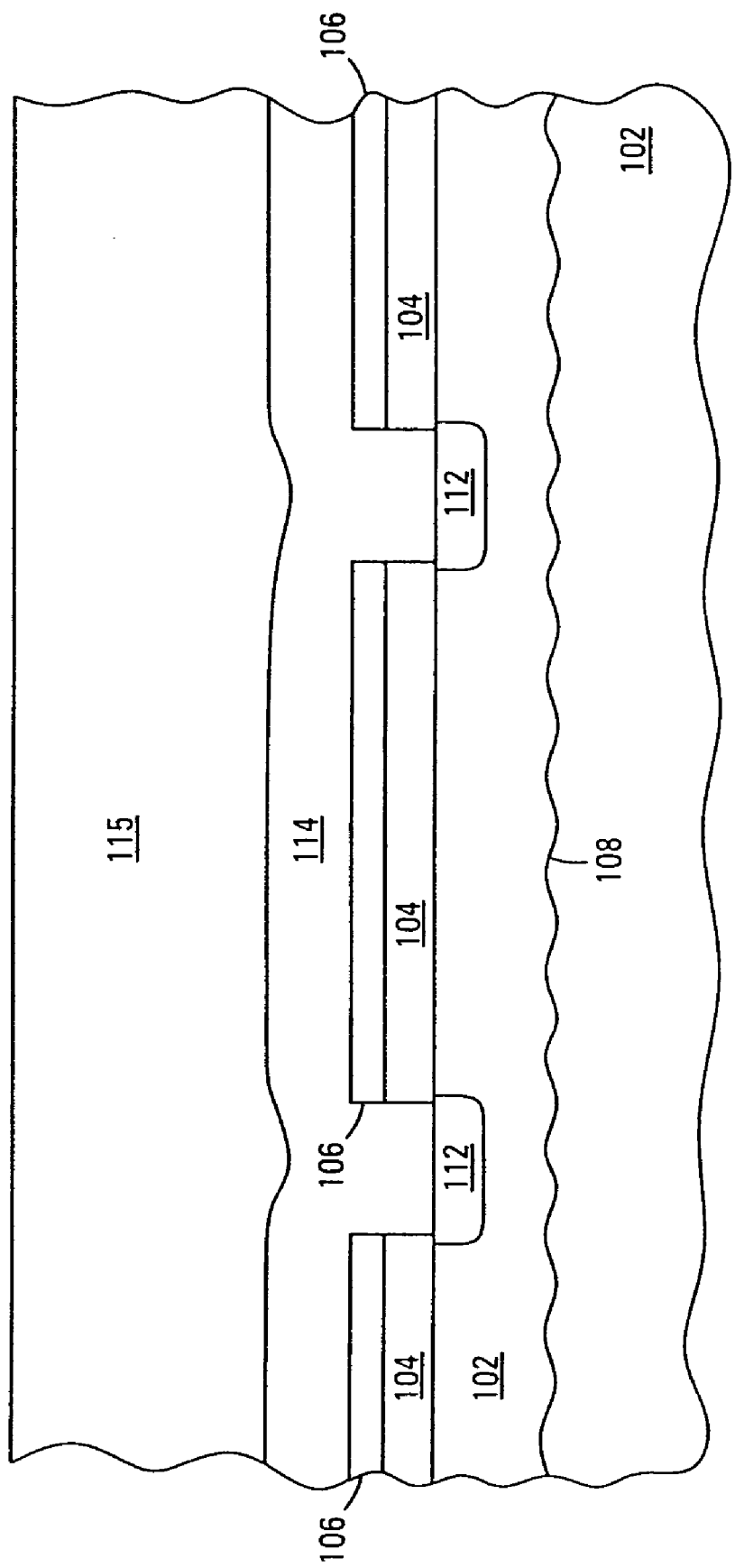
Figure 1H:
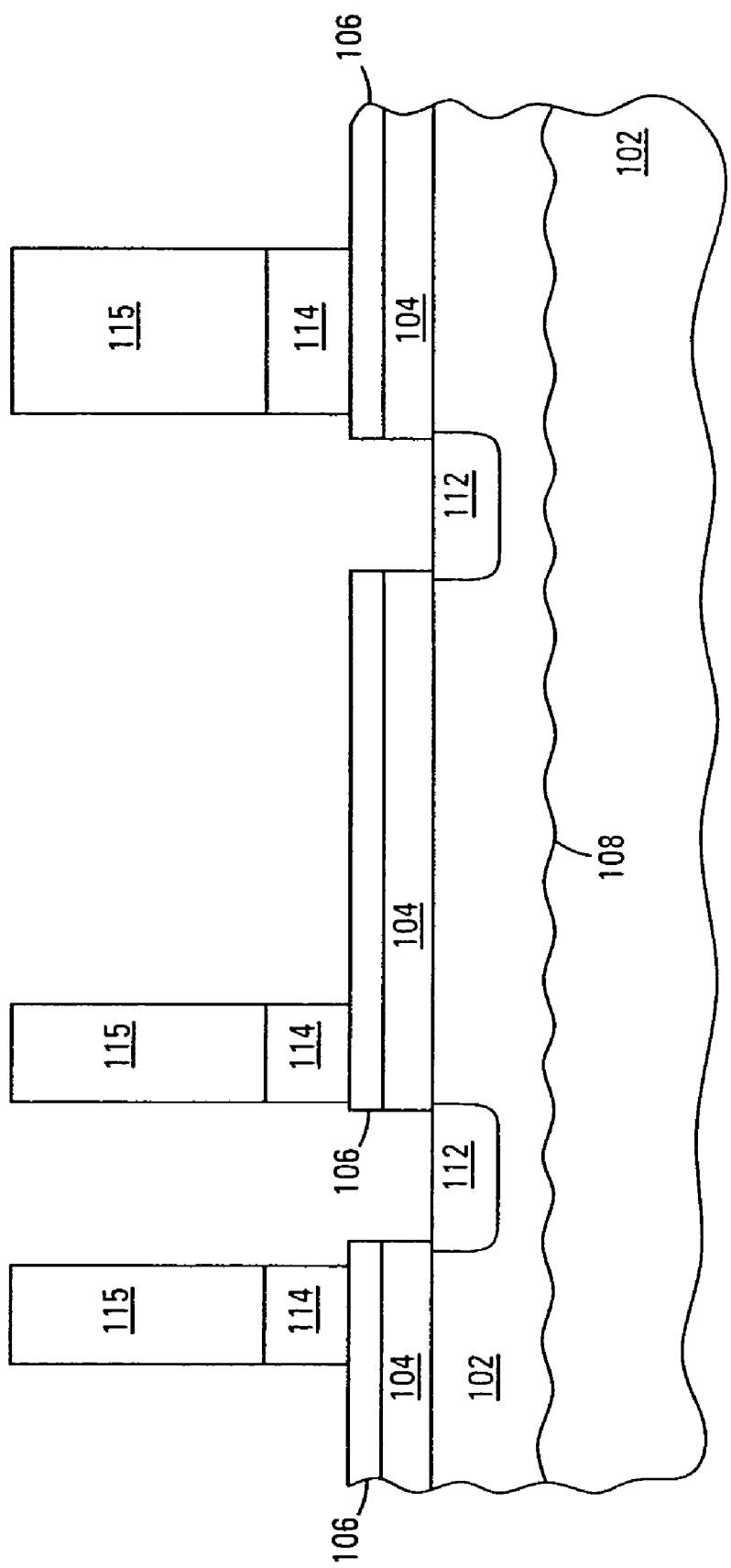
Figure 1I:
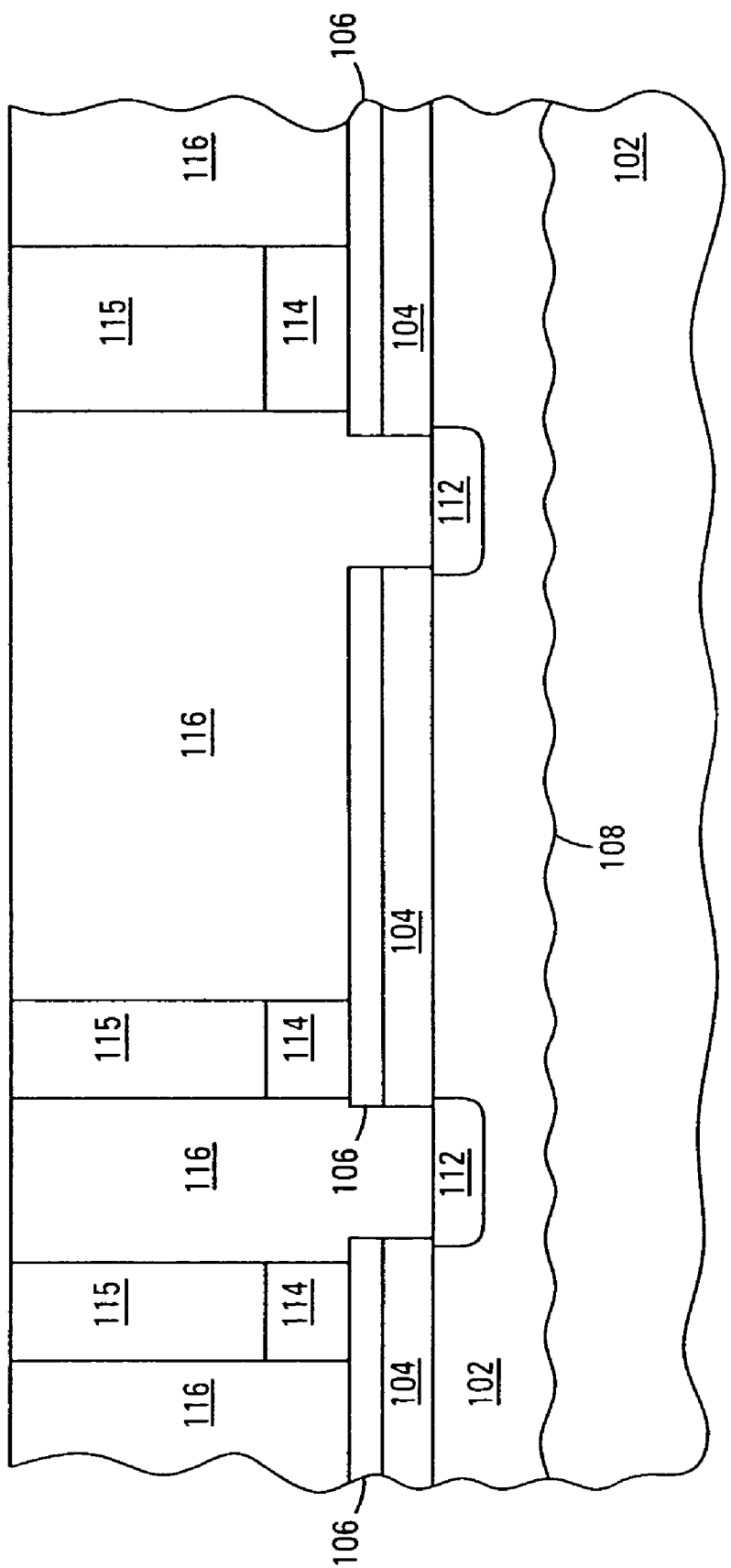
Figure 1J:
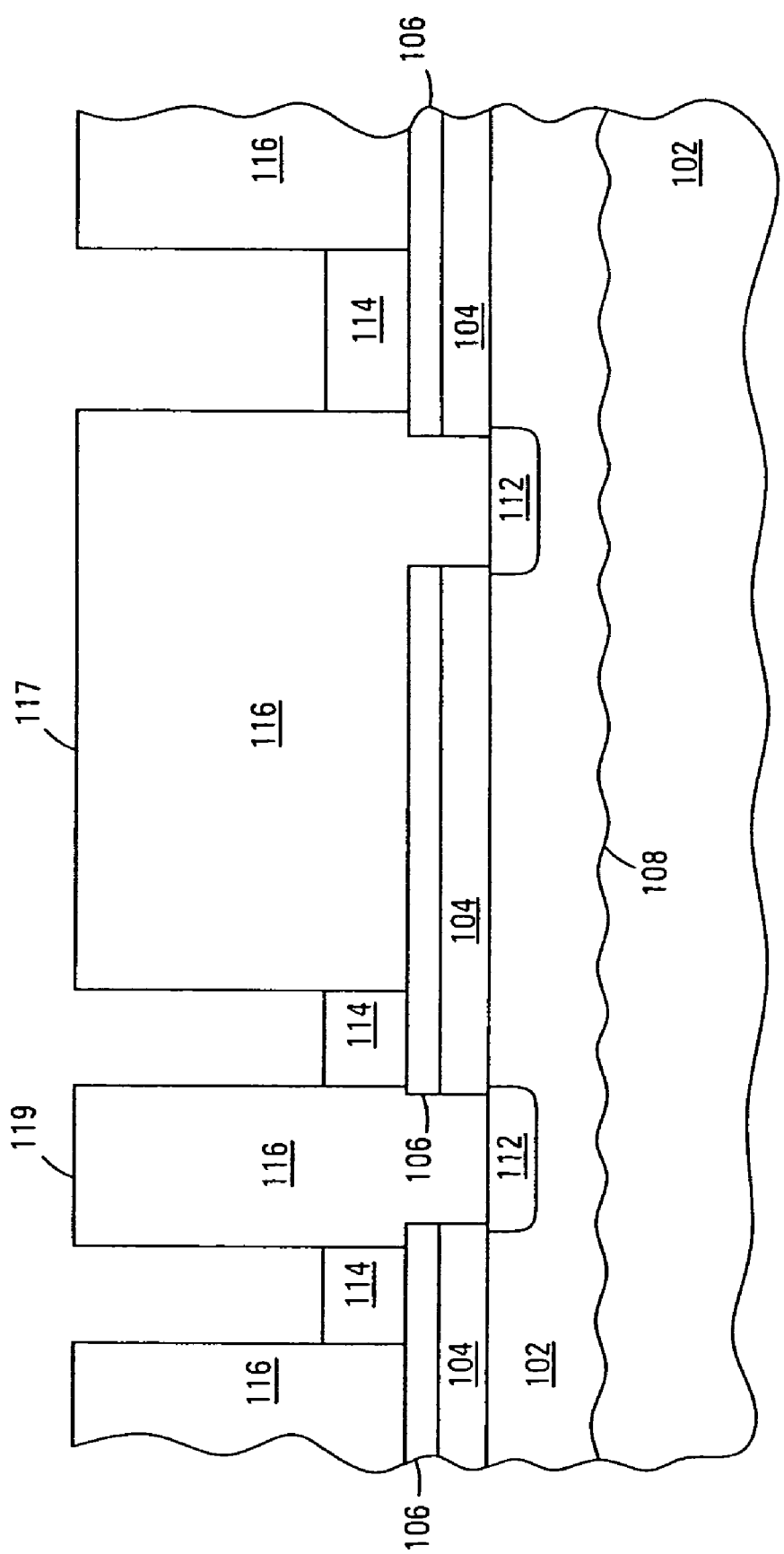
Figure 1K:
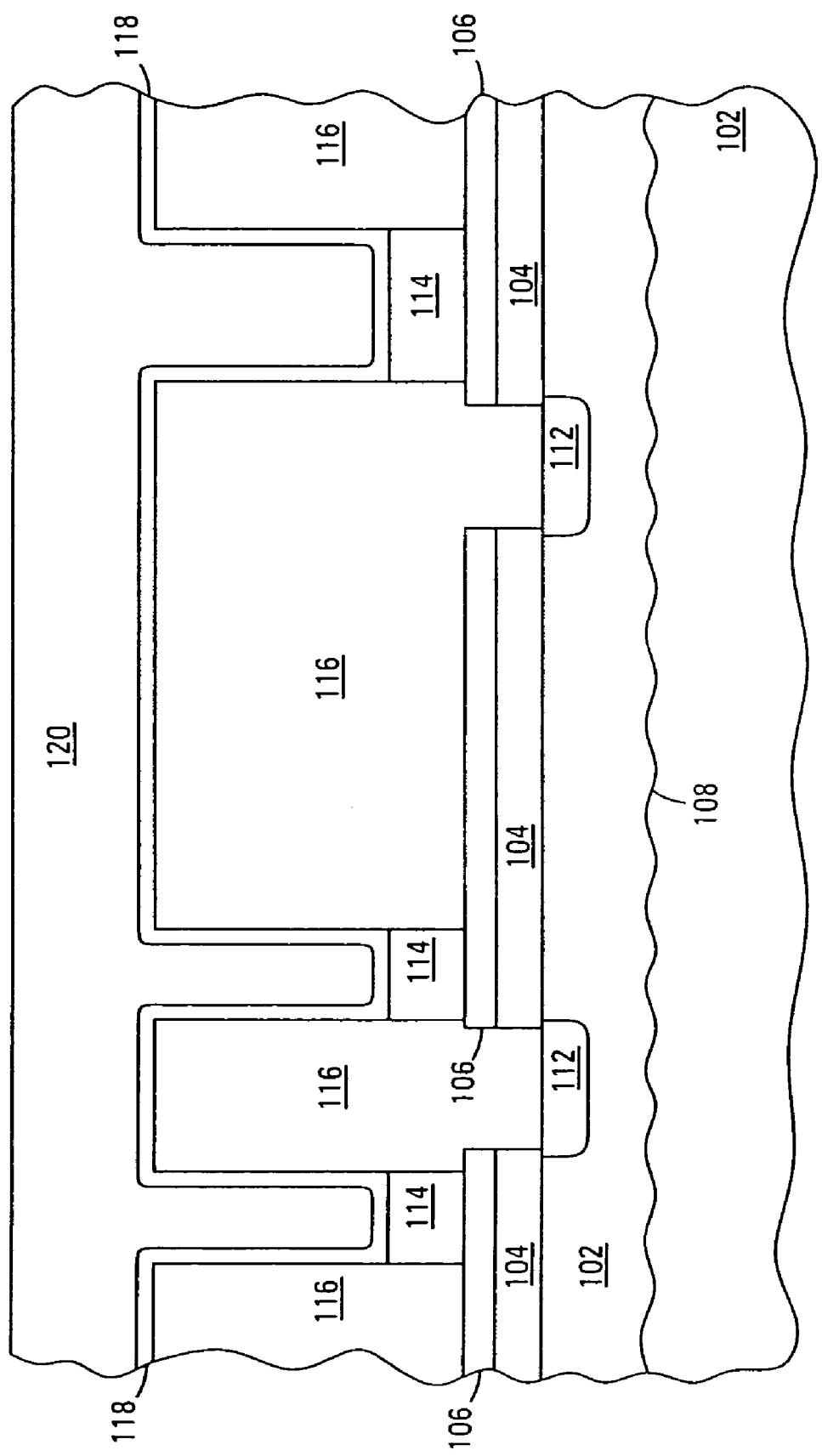
Figure 1L:
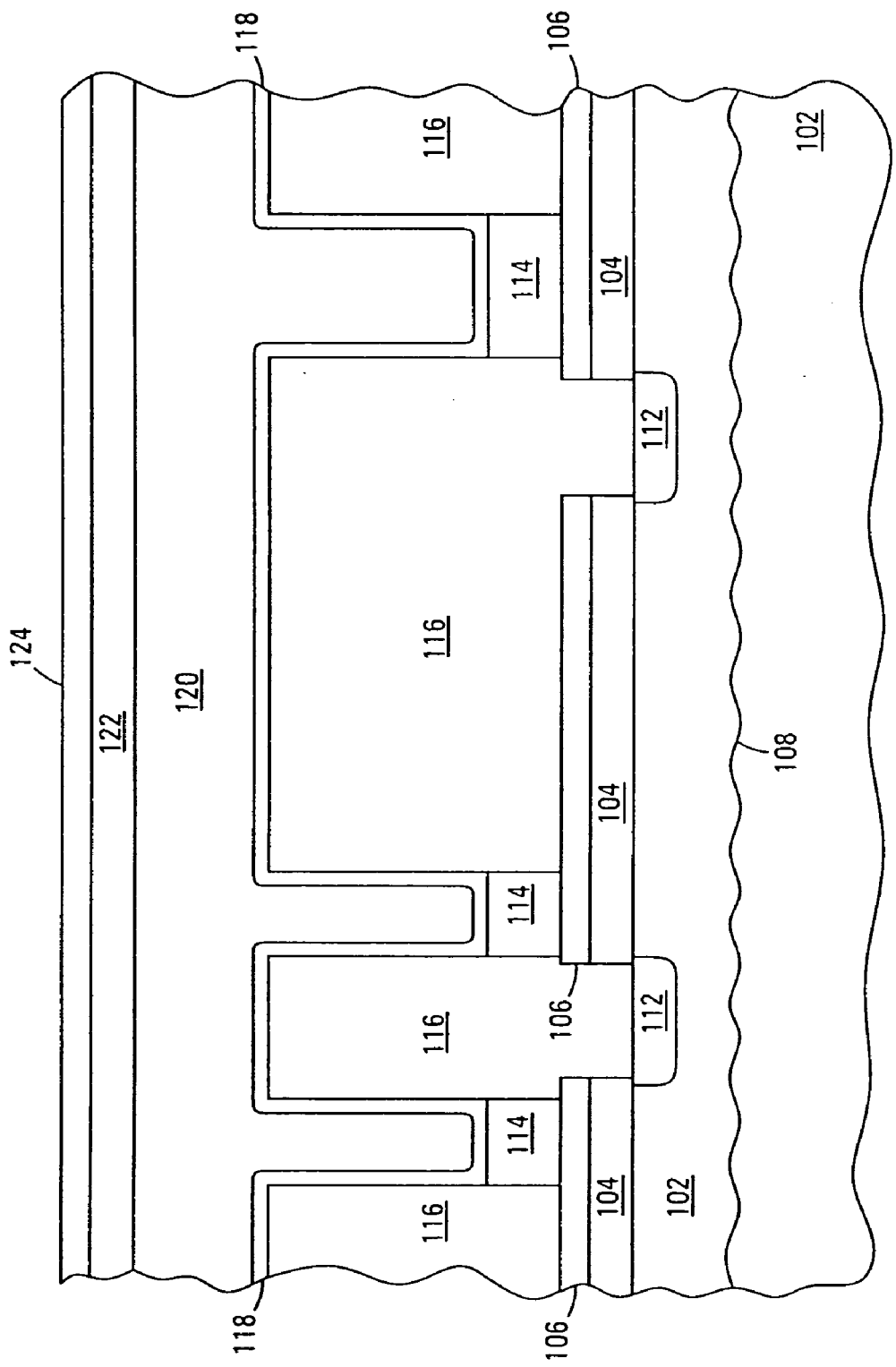
Figure 1M:
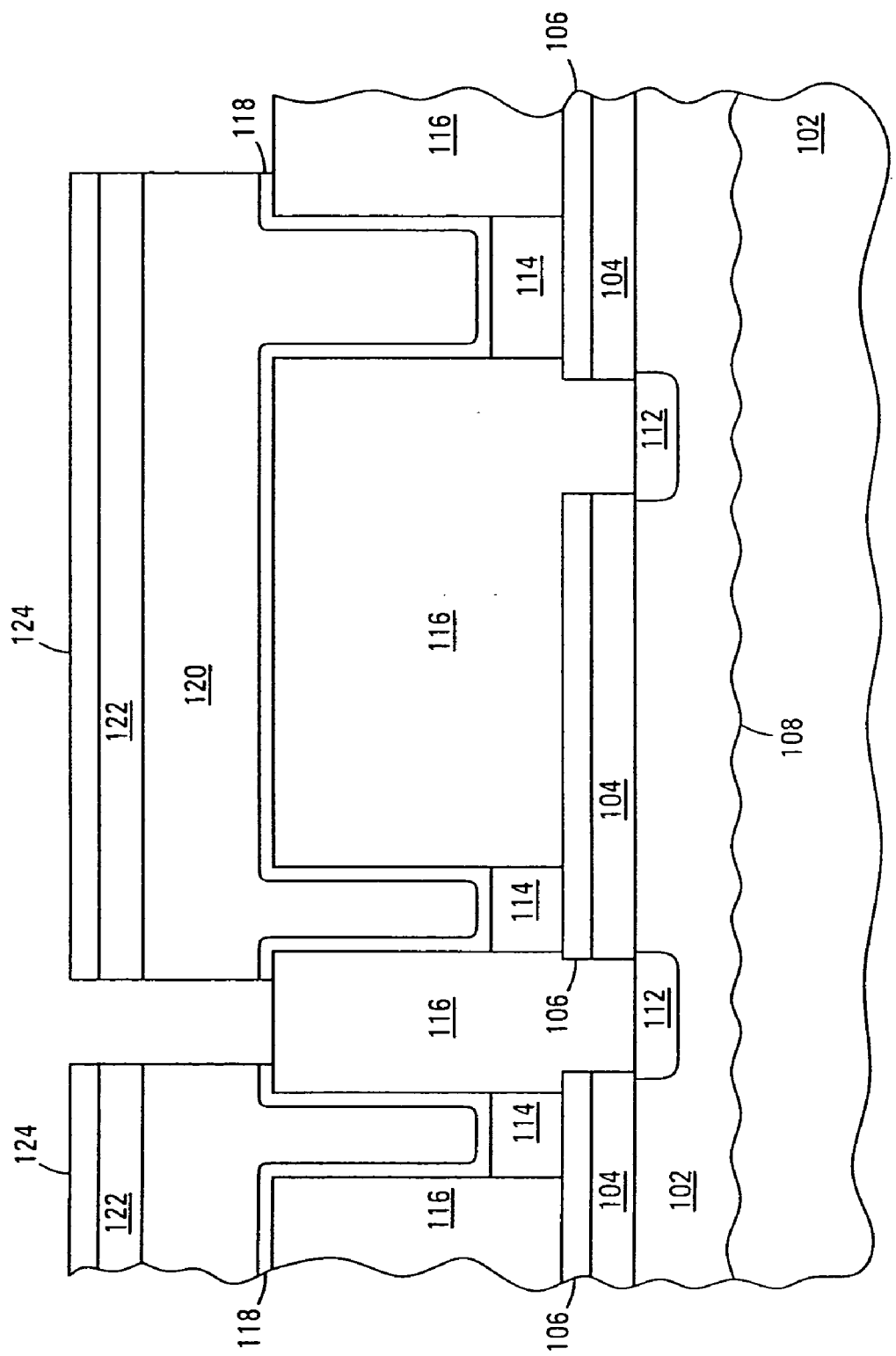
Figure 1N:
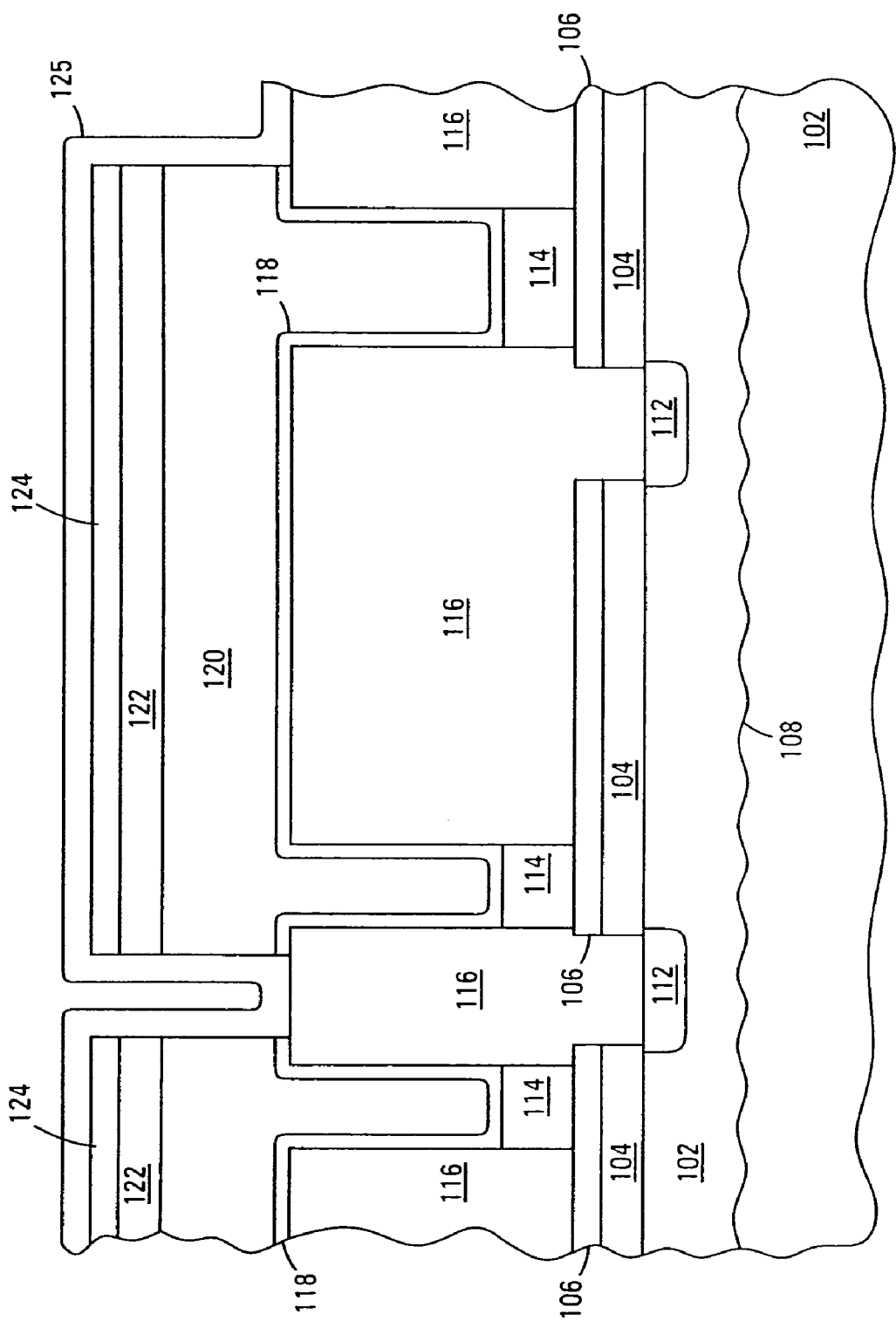
Figure 10:
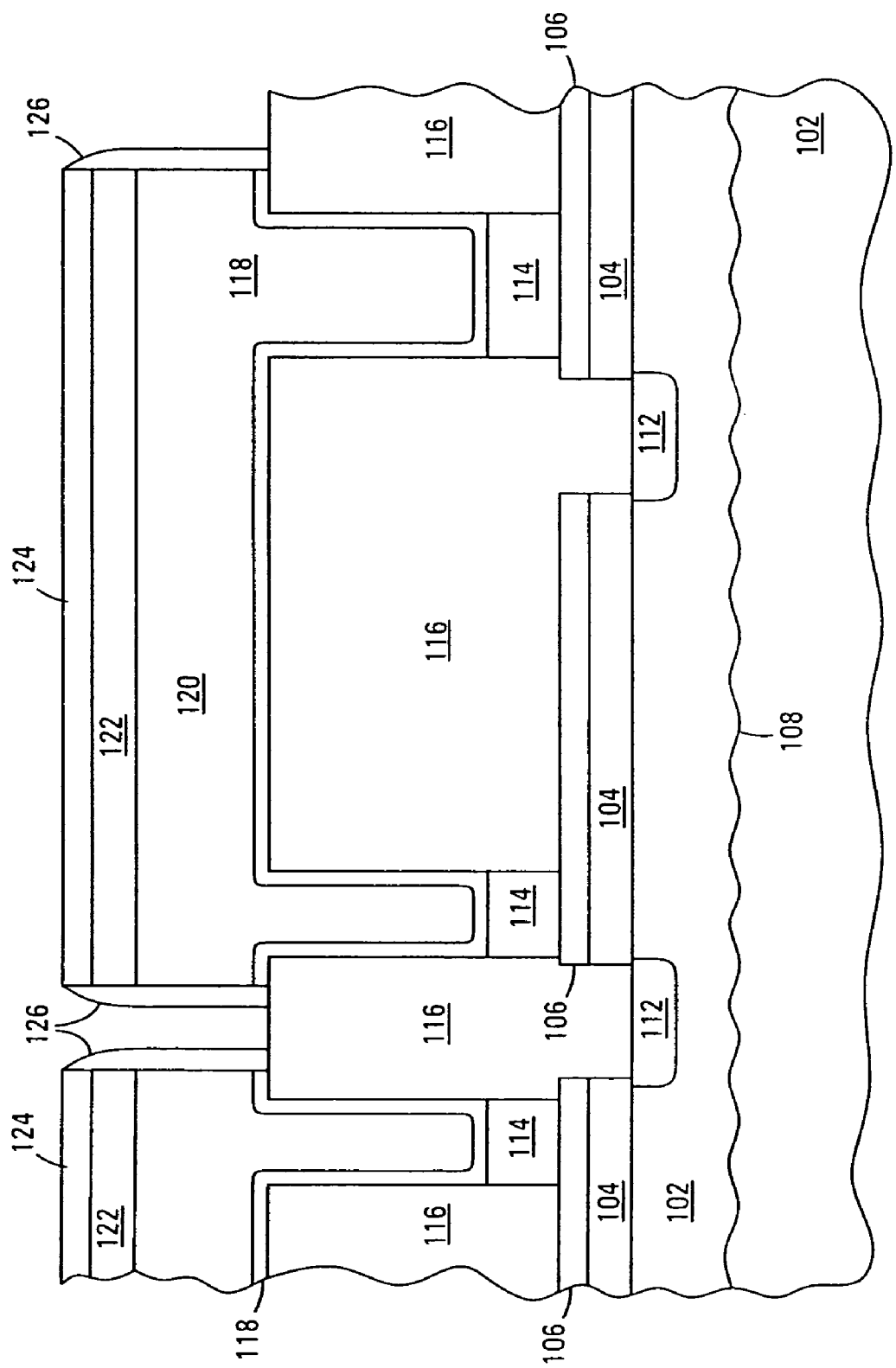
Figure 1P:
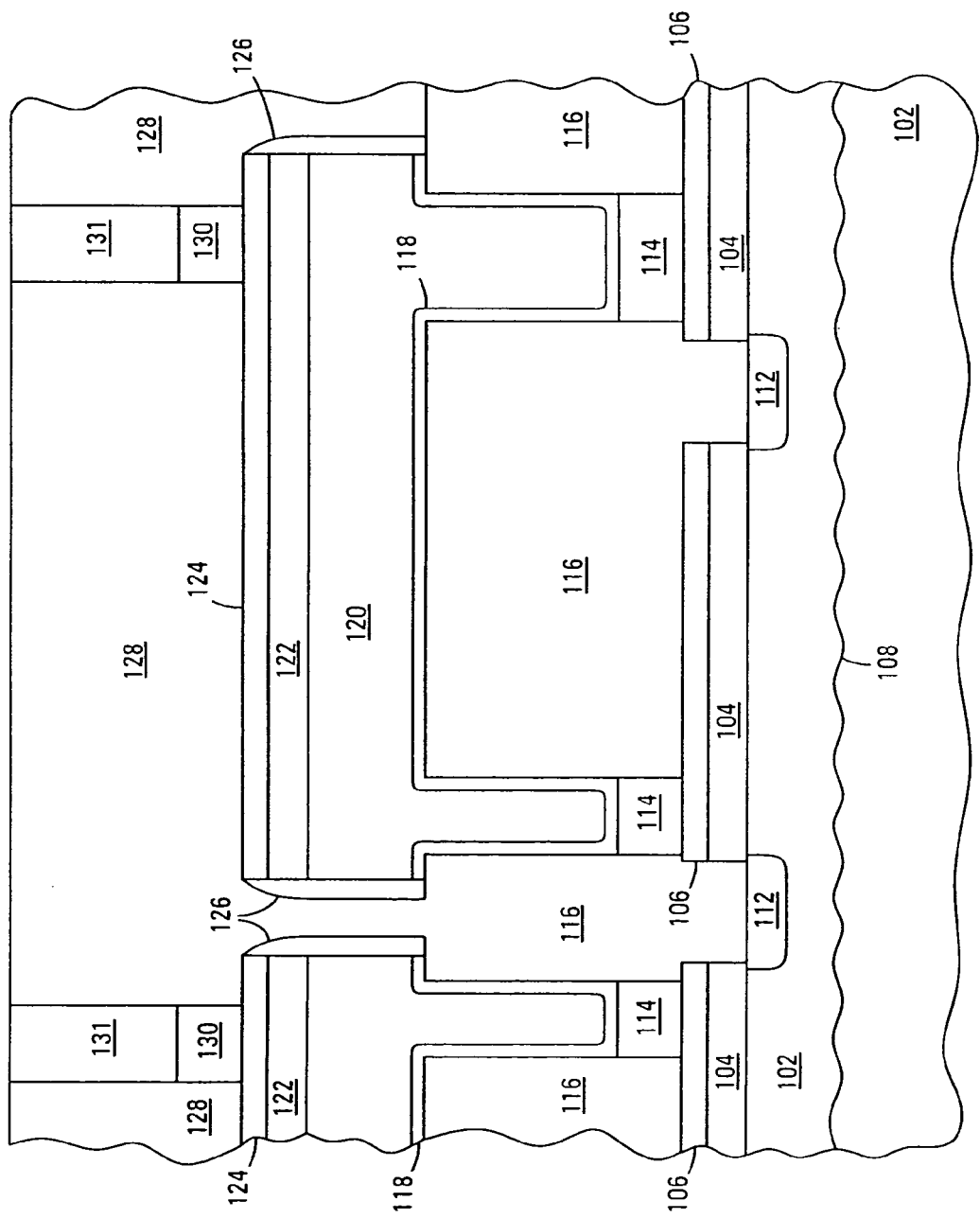
Figure 1Q:
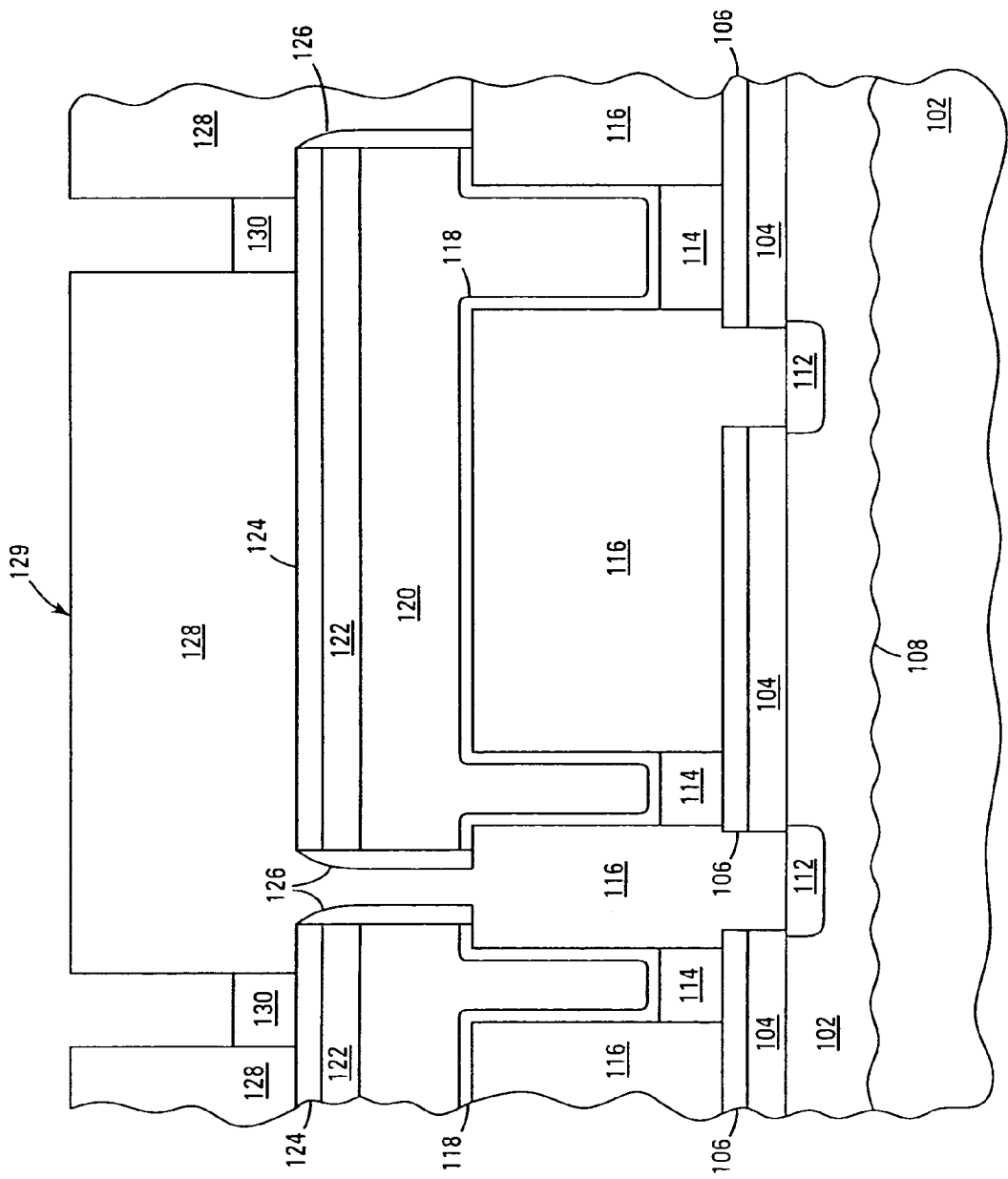
Figure 1R:
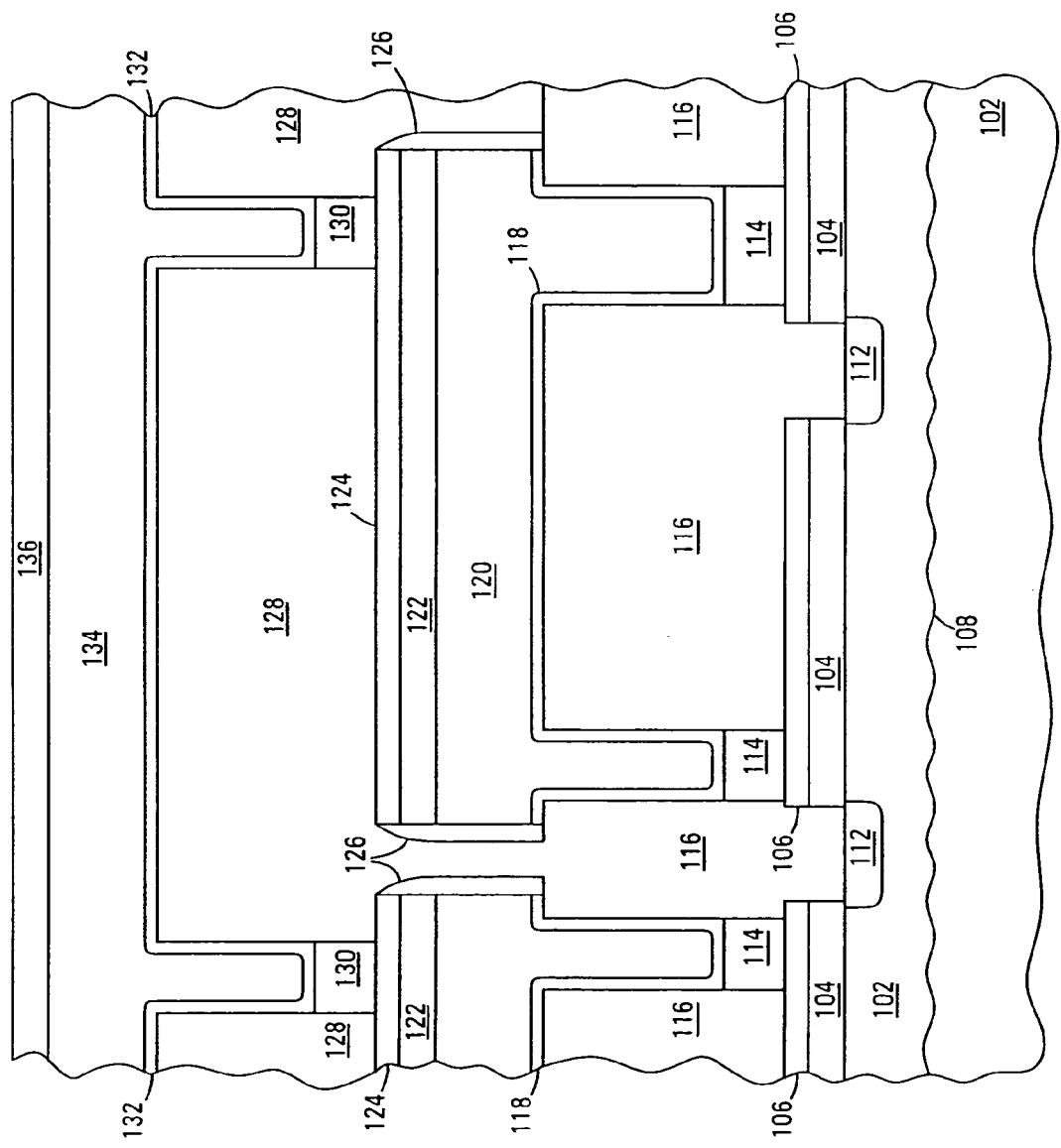
Figure 1S:
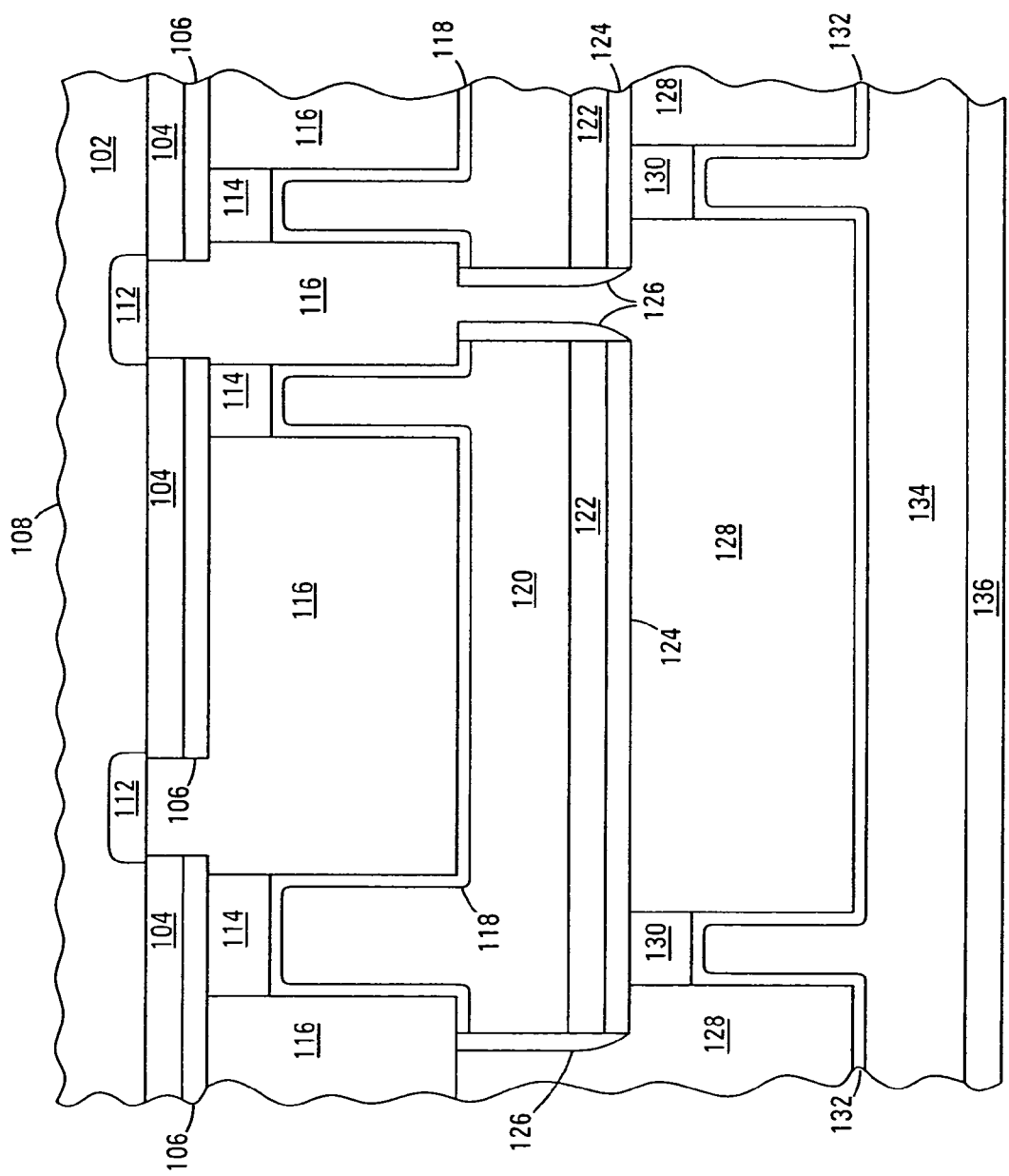
Figure 1T:
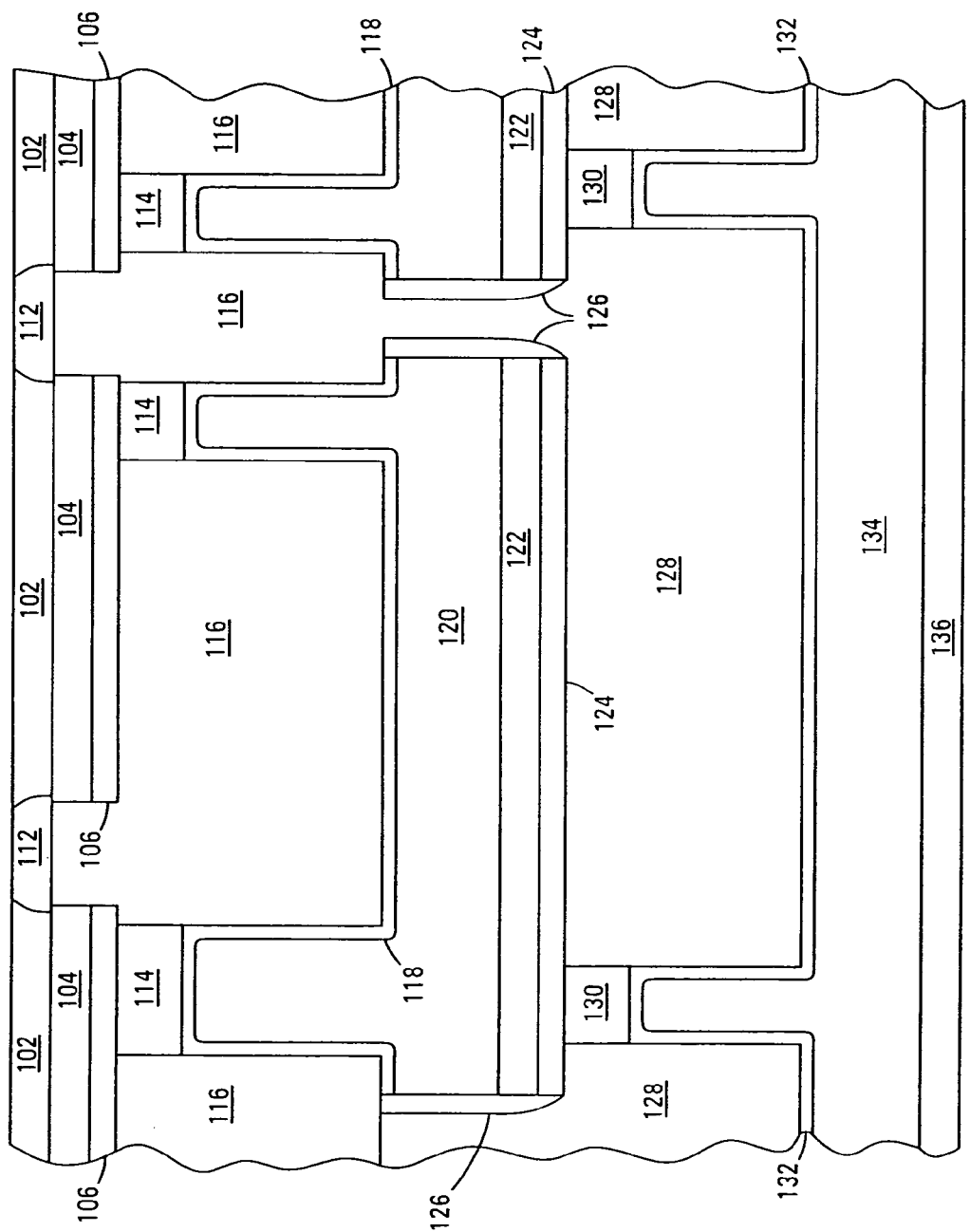
Figure 1U:
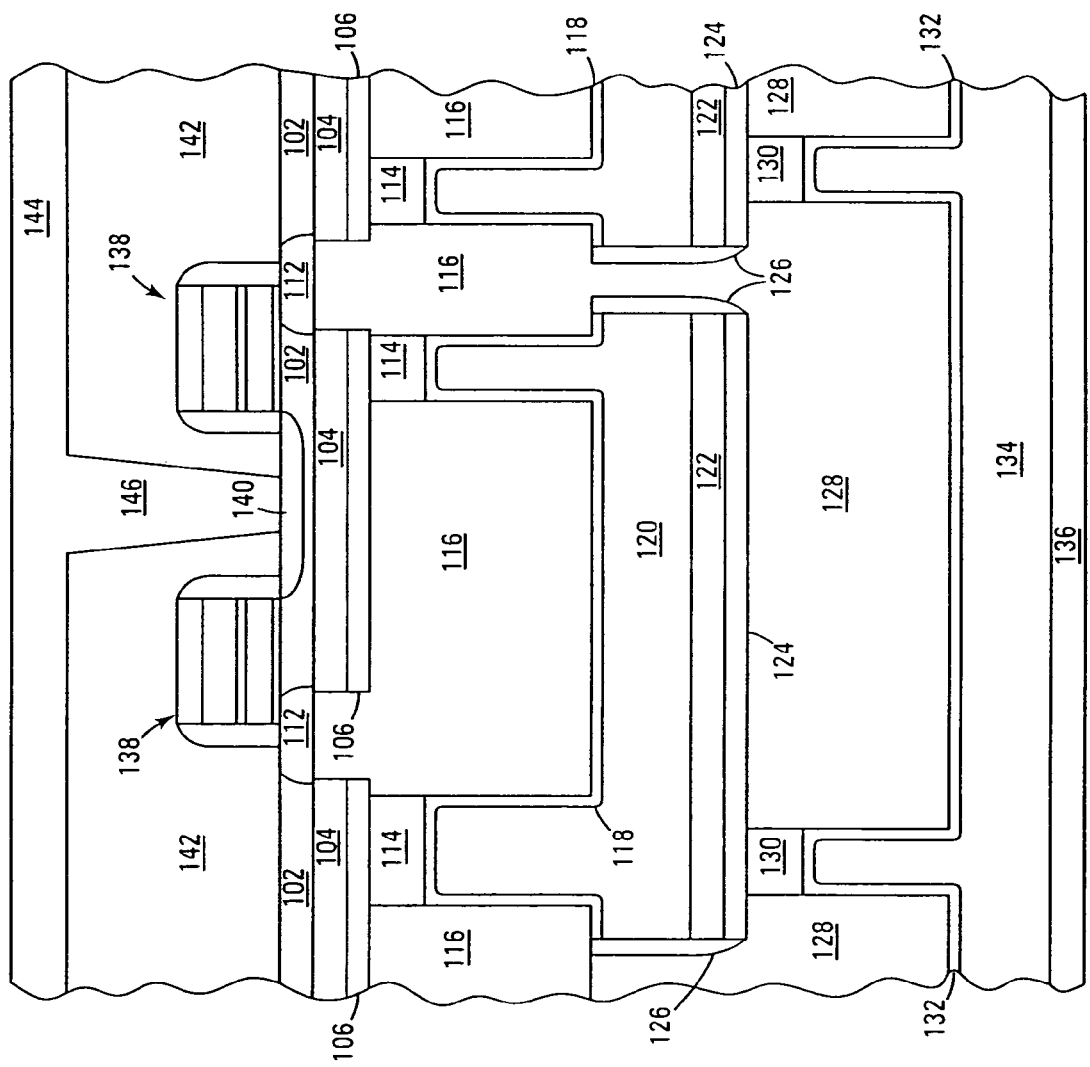

FIGS. 1A–1U depict fabrication of a portion of a memory array in accordance with one embodiment of the invention. FIGS. 1A–1U are cross-sectional views during various processing stages.

In FIG. 1A an insulative layer is formed on a surface of the substrate 102. The insulative layer may contain one or more dielectric layers, such as a first dielectric layer 104 and a second dielectric layer 106. For one embodiment, the first dielectric layer 104 is a thermally-grown silicon dioxide ($SiO_2$), but may include other dielectric materials described herein or known in the art. Typical dielectric materials include silicon oxides ($SiO/SiO_2$), silicon nitrides ($SiN/Si_2N/Si_3N_4$) and silicon oxynitrides ($SiO_xN_y$). For one embodiment, the second dielectric layer 106 is silicon nitride. Silicon nitride is commonly deposited using a chemical vapor deposition (CVD) process such as low-pressure CVD (LPCVD). Typical processing temperatures for the oxide/nitride combination described above may be around 250–300° C.

The substrate 102 may be a monocrystalline silicon material. For example, the substrate 102 may be a wafer of monocrystalline silicon having a [100] orientation. The substrate 102 is generally a semiconductor material doped to a first conductivity type, such as a p-type conductivity. As an example, the substrate 102 may be implanted with a p-type dopant, such as boron, followed by an anneal to produce a p-type substrate.

The substrate 102 is further implanted with hydrogen ($H_2$), hydrogen ions ($H^+$), deuterium ($D_2$), deuterium ions ($D^+$) or other suitable implant particle 107 to form a stressed or damaged region 108. Common implantation techniques include beam line ion implantation, plasma immersion ion implantation and ion shower. In general, the implant particle 107 is a small-mass particle chosen to pass through a portion of the substrate 102 to a desired depth without causing significant damage due to its passage. For one embodiment, the dosage in the damaged region 108 is approximately $5 \times 10^{16}$ particles/cm². For a further embodiment, the dosage in the damaged region 108 is in the range of approximately $10^{15}$ to $10^{18}$ particles/cm². The damaged region 108 is formed to allow for subsequent cleaving of the substrate. This process is commonly known as "Smart Cut" and is well understood in the art.

Following formation of the dielectric layers 104 and 106, they are patterned to expose portions of the substrate 102 for future source/drain regions and at least one cell plate junction. A cell plate junction is a connection to the substrate 102 for applying a potential to the common plates of the memory cell capacitors and will be described separate from formation of the memory cell. For one embodiment, patterning of the dielectric layers 104 and 106 includes standard photolithographic techniques. As one example, a photoresist layer 109 is formed on the uppermost dielectric layer or dielectric layer 106 in FIG. 1B. A mask 103 is used to define areas for the future source/drain regions and portions of the photoresist layer 109 are exposed to radiation 105. The example shown in FIG. 1B is that of a positive resist system where the portions of the photoresist layer 109 exposed to the radiation 105 are photosolubilized. In a positive resist system, the mask 103 blocks the radiation 105 from those portions of the photoresist layer 109 that are to remain after washing. Negative resist systems are also known where the portions of the photoresist layer 109 exposed to radiation 105 are photopolymerized. In a negative resist system, the mask 103 blocks the radiation 105 from those portions of the photoresist layer 109 that are to be removed by washing and obvious changes need to be made to mask 103 to produce the same pattern.

FIG. 1C shows the changes to the photoresist layer 109 after developing and washing. As shown in FIG. 1C, the patterned photoresist layer 109 exposes portions of the uppermost dielectric layer. These portions of the dielectric layer 106 and the underlying portions of the dielectric layer 104 are removed to define areas 111 for the future source/drain regions in the substrate 102 as shown in FIG. 1D. Removal of the exposed portions of the dielectric layers 104 and 106 may include chemical etching, reactive ion etching or other removal techniques.

For one embodiment, the damaged region 108 is formed prior to formation of one or more of the dielectric layers 104 or 106. For another embodiment, the damaged region 108 is formed after formation of the dielectric layers 104 and 106. It is known that extended exposure to elevated temperatures can cause expansion or blistering of the damaged region 108. Blistering of the substrate 102 can make registration of the patterning more difficult. It is therefore preferable to form the damaged region 108 after formation of the dielectric layers 104 and 106 to avoid blistering prior to patterning for the future source/drain regions. However, there is no prohibition to forming the damaged region 108 prior to forming the dielectric layers 104 and 106 as typical deposition temperatures for these layers will generally result in only minor blistering. Registration of subsequent patterns is not as critical and higher levels of blistering can be tolerated in subsequent processing.

For embodiments having a damaged region 108 formed prior to forming the dielectric layers 104 and 106, the effects of blistering can be mitigated by forming the damaged region 108 deeper in the substrate 102. While it is possible to form the damaged region 108 deeper in the substrate 102 by increasing the implantation energy, a less damaging approach can include adding depth to the structure after formation of the damaged region 108. As one example, an epitaxial silicon layer (not shown) can be formed on the surface of a silicon substrate 102 after forming the damaged region 108. The epitaxial silicon layer would have the same conductivity type as the silicon substrate 102. The resulting epitaxial silicon layer would be interposed between the surface of the substrate 102 and the subsequently-formed dielectric layer 104 and 106.

In FIG. 1E, first source/drain regions 112 are formed in the substrate 102 such as by conductive doping of the substrate 102. Accordingly, for a monocrystalline silicon substrate, the first source/drain regions 112 are defined by regions of conductively-doped monocrystalline silicon. First source/drain regions 112 have a conductivity type opposite the substrate 102. For a p-type substrate, first source/drain regions 112 would have an n-type conductivity. Such conductive doping may be accomplished through ion implantation of phosphorus, arsenic or other n-type dopant species 113 for this embodiment. Doping may further be accomplished through diffusion of the dopant species, such as gaseous diffusion or diffusion at an interface of a layer of heavily-doped material and the substrate 102. Before or after formation of the first source/drain regions 112, the photoresist layer 109 is removed as shown in FIG. 1F.

In FIG. 1G, an insulative layer, such as third dielectric layer 114, is formed overlying the second dielectric layer 106 and the first source/drain regions 112. The third dielectric layer 114 is preferably of a different dielectric material than the second dielectric layer 106. This permits the second dielectric layer 106 to act as an etch stop during removal of portions of the third dielectric layer 114 in subsequent processing. For one embodiment, the third dielectric layer 114 is silicon dioxide formed by CVD. As an example, the precursor tetraethylorthosilicate (TEOS) may be used to deposit silicon dioxide by CVD.

A first sacrificial layer 115 is formed overlying the third dielectric layer 114. The first sacrificial layer 115 is preferably of a different material than the third dielectric layer 114. This permits the third dielectric layer 114 to act as an etch stop during removal of portions of the first sacrificial layer 115 in subsequent processing. The first sacrificial layer 115 may be a dielectric material, but may also be a conductive or semiconductive material. For one embodiment, the first sacrificial layer 115 is a doped dielectric material such as borophosphosilicate glass (BPSG), a boron and phosphorous-doped silicon oxide material. Doped silicon oxide materials are generally easier to remove than undoped silicon oxide materials, thus facilitating removal of portions of the first sacrificial layer 115 without significant removal of the third dielectric layer 114.

If FIG. 1H, the third dielectric layer 114 and the first sacrificial layer 115 are patterned to define future cell capacitor storage nodes and extensions to future cell capacitor storage nodes. For one embodiment, patterning of the third dielectric layer 114 and the first sacrificial layer 115 includes standard photolithographic techniques as described earlier.

In FIG. 1I, a first conductive layer 116 is formed coupled to the first source/drain regions 112. The first conductive layer 116 will form the storage nodes for future upper cell capacitors and a portion of the storage nodes for future lower cell capacitors. The terms upper and lower are relative and, as will be seen in the following description, refer to the relative positions of the cell capacitors after fabrication of the memory cells is completed.

The first conductive layer 116 contains any conductive material and can be formed by a variety of methods such as CVD and physical vapor deposition (PVD) techniques. However, if the first sacrificial layer 115 is a conductive material, the first conductive layer 116 should contain a different material to facilitate preferential removal of the first sacrificial layer 115 in subsequent processing.

For one embodiment, the first conductive layer 116 is a conductively-doped polysilicon. While a first conductive layer 116 containing a conductively-doped polysilicon would have the same conductivity type as the first source/drain regions 112, it may have a different dopant concentration or even contain a different dopant species. For one embodiment, the first conductive layer 116 is formed by blanket deposition overlying the structure of FIG. 1H, followed by CMP to produce the structure shown in FIG. 1I. In this manner, a top portion of the first conductive layer 116 is removed to at least a level of the first sacrificial layer 115, thereby isolating portions of the first conductive layer 116 and defining storage nodes, or first capacitor plates, for future upper cell capacitors and conductive extensions for future storage nodes of future lower cell capacitors.

In FIG. 1J, the first sacrificial layer 115 is removed to expose the storage nodes 117 and the conductive extensions 119. Removal of the first sacrificial layer 115 may include preferentially etching the first sacrificial layer 115 over the third dielectric layer 114 and the first conductive layer 116. Each storage node 117 and extension 119 is isolated from other storage nodes 117 or extensions 119, as well as other portions of the first conductive layer 116. As the storage nodes 117 and extensions 119 are formed of the same layer, they are laterally adjacent each other.

Following definition of storage nodes 117 and extensions 119, a first capacitor dielectric layer 118 is formed in FIG. 1K. The first capacitor dielectric layer 118 covers at least the exposed portions of the first conductive layer 116 defining the storage nodes 117 and the extensions 119.

The first capacitor dielectric layer 118 contains a dielectric material. For one embodiment, the first capacitor dielectric layer 118 contains silicon nitride. For another embodiment, the first capacitor dielectric layer 118 contains a silicon oxynitride. Other dielectric materials may also be used, including dielectric metal oxides. Some examples include $Ba_zSr_{(1-z)}TiO_3$ [BST; where 0<z<1], $BaTiO_3$, $SrTiO_3$, $PbTiO_3$, $Pb(Zr,Ti) O_3$[PZT], $(Pb,La)(Zr,Ti)O_3$ [PLZT], $(Pb,La)TiO_3$[PLT], $Ta_2O_5$, $KNO_3$, $Al_2O_3$ and $LiNbO_3$. The capacitor dielectric layer 118 may be formed by any deposition technique, e.g., RF-magnetron sputtering, CVD or other suitable deposition technique and may include a post-deposition oxidation or nitridation.

Following formation of the first capacitor dielectric layer 118, a second conductive layer 120 is formed. The second conductive layer 120 contains any conductive material. For one embodiment, the second conductive layer 120 contains conductively-doped polysilicon. The second conductive layer 120 completes the formation of the upper cell capacitors as the cell plate of such capacitors. Each upper cell capacitor includes a storage node 117, the first cell dielectric layer 118 and the second conductive layer, or cell plate, 120. The second conductive layer 120 and the first cell dielectric layer 118 are generally continuous such that they are shared among multiple, if not all, of the upper cell capacitors of the memory array.

In FIG. 1L an insulative layer is formed on the second conductive layer 120. The insulative layer may include one or more dielectric layers, such as a fourth dielectric layer 122 and a fifth dielectric layer 124. For one embodiment, the fourth dielectric layer 122 is a thermally-grown silicon dioxide ($SiO_2$) where the second conductive layer 120 is a silicon-containing material. The fourth dielectric layer 122 may further include other dielectric materials described herein or known in the art. For one embodiment, the fifth dielectric layer 124 is silicon nitride, but may include other dielectric materials described herein or known in the art.

Following formation of the dielectric layers 122 and 124, the fifth dielectric layer 124, the fourth dielectric layer 122, the second conductive layer 120 and the first cell dielectric layer 118 are patterned and removed to expose those portions of the first conductive layer 116 defining the extensions 119. For one embodiment, patterning of the dielectric layers 122 and 124 includes standard photolithographic and etching techniques. It is recognized that where the first conductive layer 116 and the second conductive layer 120 contain the same material, some portion of the first conductive layer 116 may also be removed.

In FIG. 1N, a spacer layer 125 is formed. The spacer layer 125 contains a dielectric material and covers at least the exposed portions of the second conductive layer 120. In FIG. 1O, portions of the spacer layer 125 are removed to define spacers 126. Removal of portions of the spacer layer 125 may include anisotropic etching to preferentially remove horizontal portions of the spacer layer 125, leaving vertical portions adjacent sidewalls of the second conductive layer 120, as well as the first capacitor dielectric layer 118, the fourth dielectric layer 122 and the fifth dielectric layer 124. The spacers 126 insulate at least exposed sidewalls of the second conductive layer 120 adjacent the exposed portion of the extension 119.

Similar to the processing described with reference to FIGS. 1G–1I, a sixth dielectric layer 130 is formed overlying the fifth dielectric layer 124 and the exposed portions of the first conductive layer 116, i.e., exposed portions of the extensions 119, as shown in FIG. 1P. The sixth dielectric layer 130 is preferably of a different dielectric material than the fifth dielectric layer 124. This permits the fifth dielectric layer 124 to act as an etch stop during removal of portions of the sixth dielectric layer 130. For one embodiment, the sixth dielectric layer 130 is silicon dioxide formed by CVD. As an example, the precursor tetraethylorthosilicate (TEOS) may be used to deposit silicon dioxide by CVD.

A second sacrificial layer 131 is formed overlying the sixth dielectric layer 130. The second sacrificial layer 131 is preferably of a different material than the sixth dielectric layer 130. This permits the sixth dielectric layer 130 to act as an etch stop during removal of portions of the second sacrificial layer 131. The second sacrificial layer 131 may be a dielectric material, but may also be a conductive or semiconductive material. For one embodiment, the second sacrificial layer 131 is a doped dielectric material such as borophosphosilicate glass (BPSG), a boron and phosphorous-doped silicon oxide material. Doped silicon oxide materials are generally easier to remove than undoped silicon oxide materials, thus facilitating removal of portions of the second sacrificial layer 131 without significant removal of the sixth dielectric layer 130.

The sixth dielectric layer 130 and the second sacrificial layer 131 are patterned to define future cell capacitor storage nodes. For one embodiment, patterning of the sixth dielectric layer 130 and the second sacrificial layer 131 includes standard photolithographic techniques as described earlier.

A third conductive layer 128 is formed coupled to the exposed portions of the first conductive layer 116 and thus the extensions 119. The third conductive layer 128 and the extensions 119 will form the storage nodes for future lower cell capacitors. The third conductive layer 128 contains any conductive material and can be formed by a variety of methods such as CVD and physical vapor deposition (PVD) techniques. However, if the second sacrificial layer 131 is a conductive material, the third conductive layer 128 should contain a different material to facilitate preferential removal of the second sacrificial layer 131 in subsequent processing.

For one embodiment, the third conductive layer 128 is a conductively-doped polysilicon. While a third conductive layer 128 containing a conductively-doped polysilicon would have the same conductivity type as the first conductive layer 116, it may have a different dopant concentration or even contain a different dopant species. For one embodiment, the third conductive layer 128 is formed by blanket deposition followed by CMP to produce the structure shown in FIG. 1P.

In FIG. 1Q, the second sacrificial layer 131 is removed to define storage nodes 129, or first capacitor plates, for future lower cell capacitors. A storage node 129 includes an extension 119 and its associated portion of the third conductive layer 128. While not apparent from FIG. 1Q, each storage node 129 is isolated from other storage nodes 129 and other portions of the third conductive layer 128. Following definition of storage nodes 129, a second capacitor dielectric layer 132 is formed in FIG. 1R. The second capacitor dielectric layer 132 covers at least the exposed portions of the third conductive layer 128 defining the storage nodes 129. Following formation of the second capacitor dielectric layer 132, a fourth conductive layer 134 is formed. The fourth conductive layer 134 contains any conductive material. For one embodiment, the fourth conductive layer 134 contains conductively-doped polysilicon. The fourth conductive layer 134 completes the formation of the lower cell capacitors as the cell plate of such capacitors. Each lower cell capacitor includes a storage node 129, the second cell dielectric layer 132 and the fourth conductive layer, or cell plate, 134. The fourth conductive layer 134 and the second cell dielectric layer 132 are generally continuous such that they are shared among multiple, if not all, of the lower cell capacitors of the memory array.

Following formation of the fourth conductive layer 134, a third insulative layer 136 is formed overlying the fourth conductive layer 134 to electrically insulate the underlying structure as well as provide protection from mechanical damage. The insulative layer 136 further provides a bonding surface for a wafer handle used during cleaving of the substrate 102. The insulative layer 136 generally contains any dielectric material. For one embodiment, the insulative layer 136 contains a doped silicon oxide material, such as BPSG.

In FIG. 1S, the substrate 102 has been cleaved at the damaged region 108. The cleaving process generally involves heating the substrate 102 to a temperature sufficient to fracture the substrate at the damaged region 108, followed by separation of the substrate at the damaged region 108. While blistering at the damaged region 108 may have occurred causing deformation of the substrate 102, cleaving reduces the stress in the damaged region 108 and has a tendency to relax any such deformation.

In FIG. 1T, the exposed, or cleaved, surface of the substrate 102 is planarized, such as by CMP, to expose the first source/drain regions 112. At this point, any remaining deformation from blistering of the damaged region 108 is removed.

In FIG. 1U, the pair of memory cells are completed using standard processing. Word lines 138 are formed on the substrate 102 between the first source/drain regions 112. Word line construction is well known in the art and generally includes a conductor overlying a gate dielectric layer. Common construction includes a gate dielectric layer overlying the substrate 102, a conductively-doped polysilicon layer overlying the gate dielectric layer, a conductive barrier layer overlying the conductively-doped polysilicon layer, a metal layer overlying the conductive barrier layer, an insulative cap layer overlying the metal layer, and insulative spacers covering the sidewalls of the various layers. For one embodiment, each word line 138 extends over a portion of its associated first source/drain region 112. For another embodiment, a first source/drain region 112 lies completely underneath, i.e., is fully covered by, its associated word line 138.

A second source/drain region 140 is formed in the substrate between the word lines 138. The second source/drain region 140 is a conductively-doped region formed in the substrate 102. The second source/drain region 140 has the same conductivity type as the first source/drain regions. Formation of the second source/drain region 140 generally follows the same guidelines as presented for formation of the first source/drain regions 112. A channel region is defined as the portion of the substrate 102 between a first source/drain region 112 and its associated second source/drain region 140.

A bit-line contact 146 is coupled between the second source/drain region 140 and a bit line 144. The bit line 144 and the bit-line contact 146 generally contain any conductive material and often include metals. The word lines 138 are separated from the bit line 144 and the bit-line contact 146 by an insulative material 142.

Each word line 138 represents an access transistor to one of the capacitors in a memory cell. When a word line 138 is activated, its associated cell capacitor shares its charge with the bit line 144. The change in charge of the bit line 144 is then sensed to determine the data value of the memory cell.

The cell capacitor for the memory cell on the left of FIG. 1U has a storage node 117 formed in the same level as the extension 119 to the cell capacitor for the memory cell on the right of FIG. 1U. The cell capacitor for the memory cell on the left of FIG. 1U is overlying at least a portion of the other cell capacitor. Note that the terms underlying, overlying, above and below are relative. During device fabrication, the uppermost layer is taken to be the most recently formed layer. Subsequent to fabrication of the device, these terms are relative to the word lines, with the word lines being above their channels.

The resulting capacitors are generally referred to as container capacitors. Container capacitors are often utilized to increase capacitor surface area, and thus capacitance, for a given footprint. Such capacitors differ from planar capacitors and trench capacitors in that the effective dielectric layer forms a "container" shape.

For proper operation of memory cells of the type described with reference to FIGS. 1A–1U, the cell plates of the upper and lower capacitors must be connected to a potential node, usually a ground potential. While there are many ways to couple the cell plates to a potential node, one technique is described with reference to FIGS. 2A–2F. FIGS. 2A–2F are cross-sectional views of fabrication of another portion of the memory array of FIGS. 1A–1U showing one embodiment of providing a potential node to the capacitor cell plates. For the embodiment shown in FIGS. 2A–2F, the same masks and pattern are utilized for formation of the various structures while an additional mask and removal processing provides for common coupling of the two cell plates.

Figure 2A:
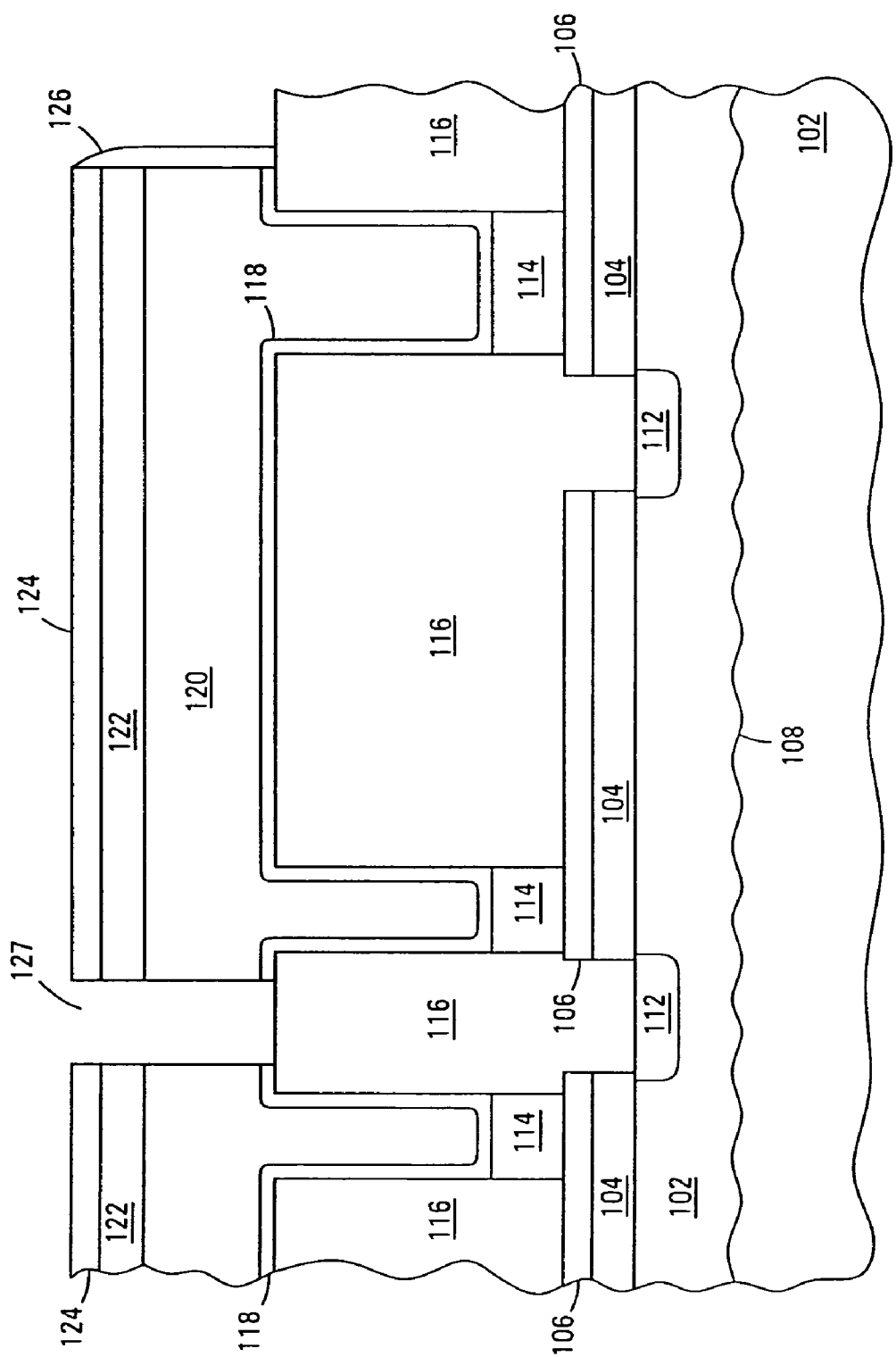

Processing can proceed as described with reference to FIGS. 1A–1O through the formation of spacers 126. As shown in FIG. 2A, one or more sets of spacers 126 may be removed to create opening 127 having a bottom defined by an exposed portion of the first conductive layer 116 and sidewalls defined at least in part by exposed portions of the second conductive layer 120. Recall that the second conductive layer 120 forms the cell plate of the upper capacitors. Removal of the spacers 126 may be accomplished by masking the surface of the structure to expose only those spacers 126 to be removed. Using the example of silicon nitride for the spacers 126, the exposed spacers may then be removed by such processing as an isotropic nitride etch.

Figure 2B:
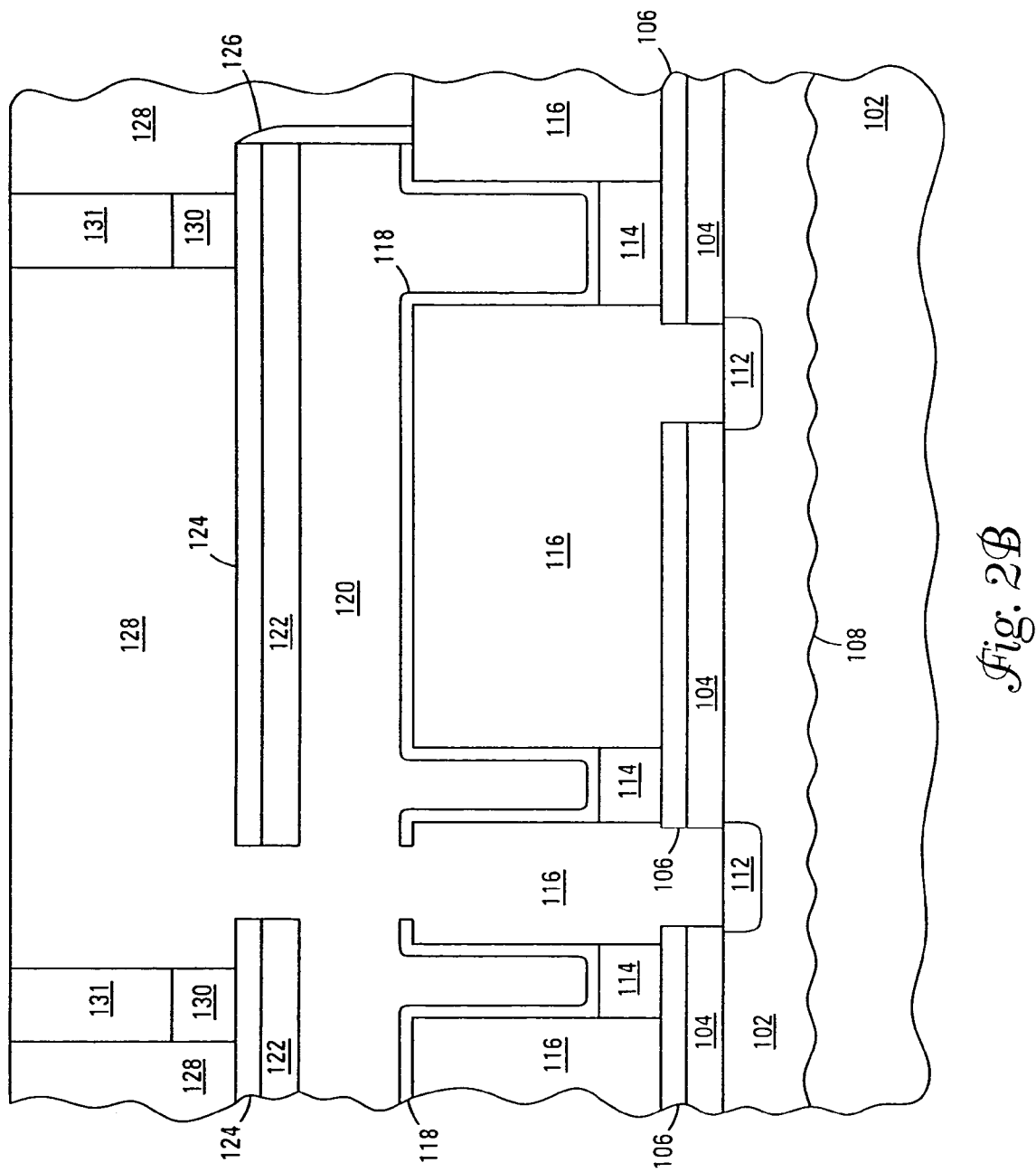

In FIG. 2B, processing proceeds as described with reference to FIG. 1P, thus forming the third conductive layer 128 coupled to the second conductive layer 120 and a portion of the first conductive layer 116. As the patterning of the first conductive layer 116 results in isolated sections rather than a contiguous layer, there is no electrical connection between the second conductive layer 120 or the third conductive layer 128 and any of the capacitor storage nodes.

Figure 2C:
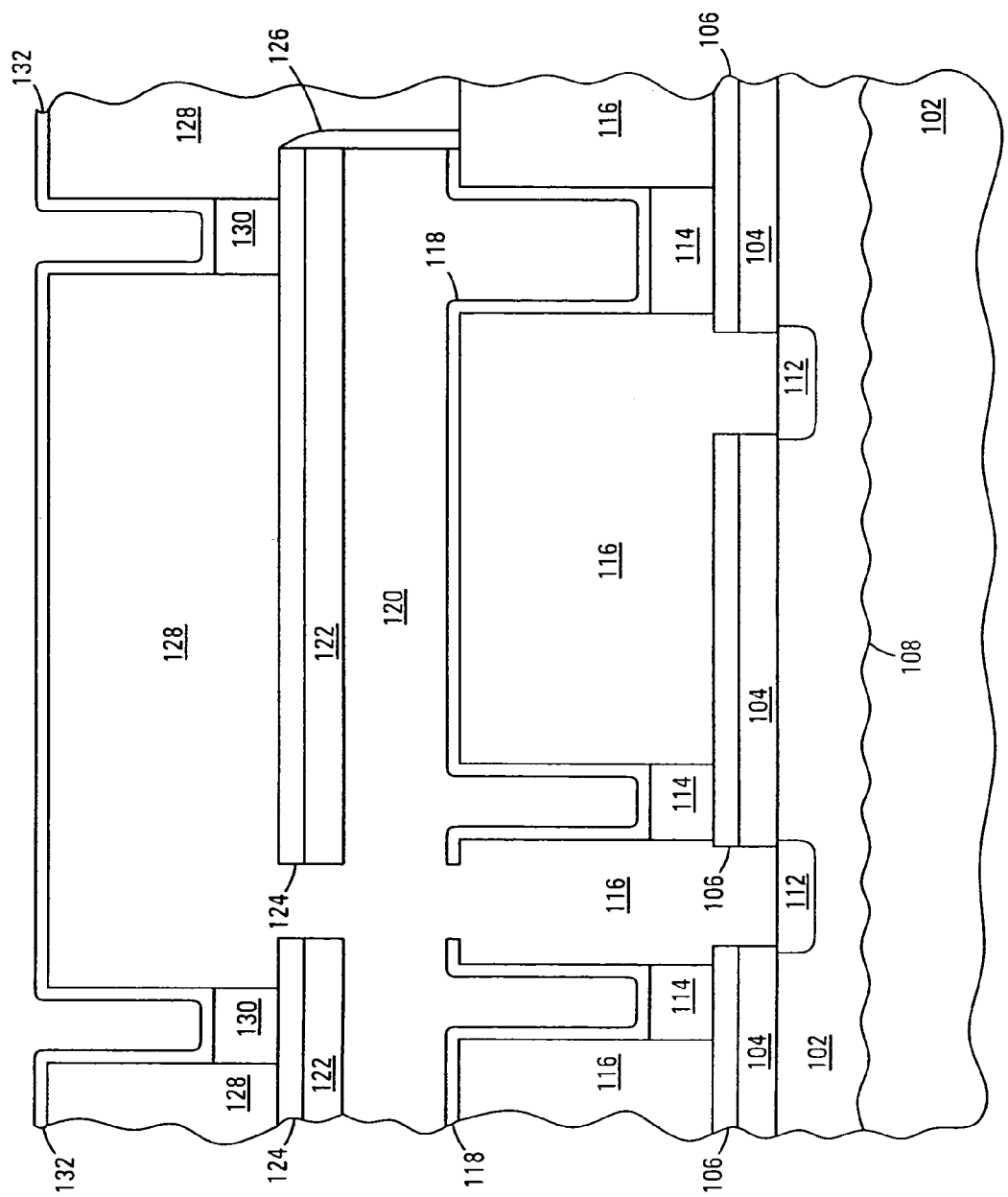
Figure 2D:
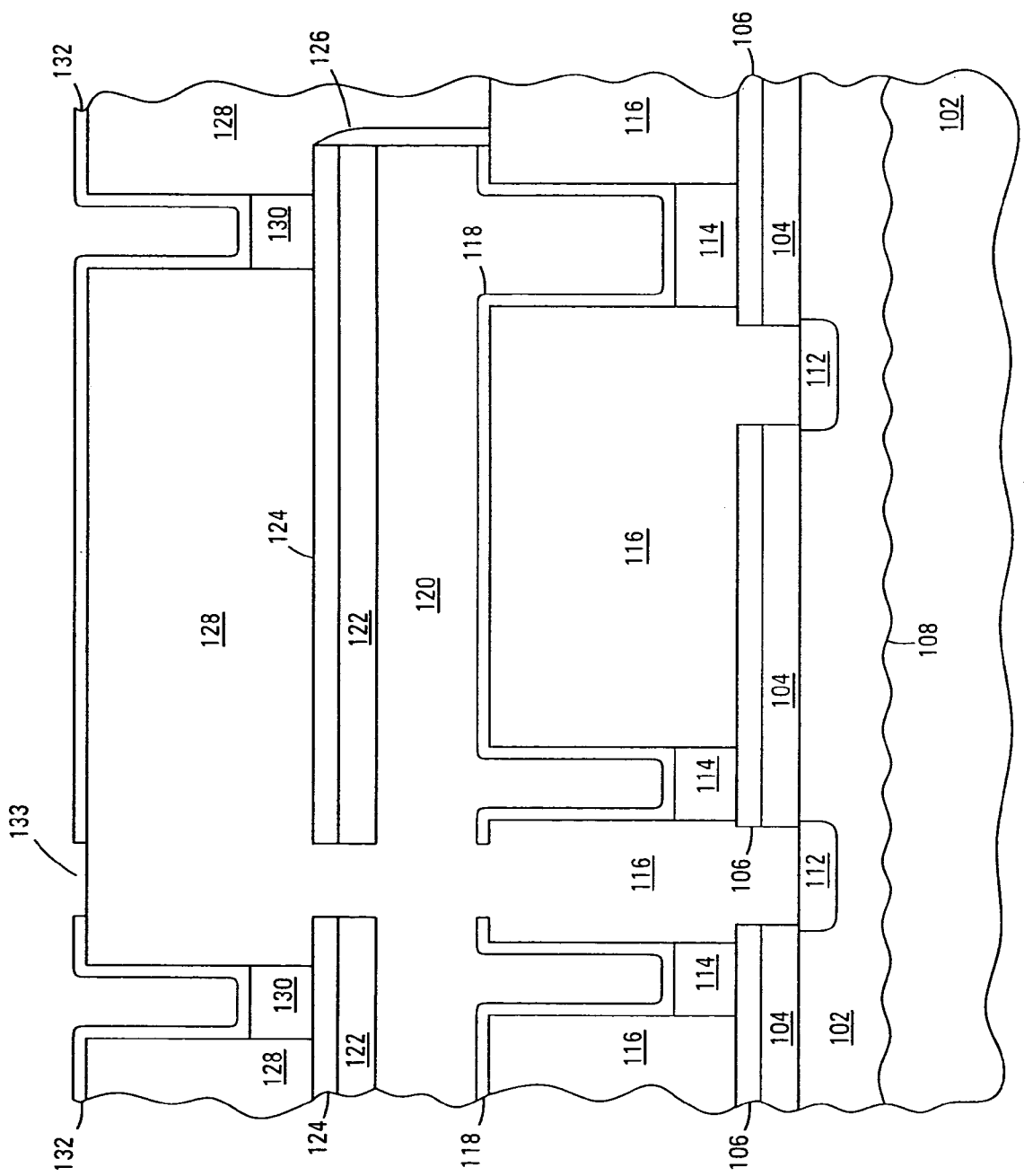
Figure 2E:
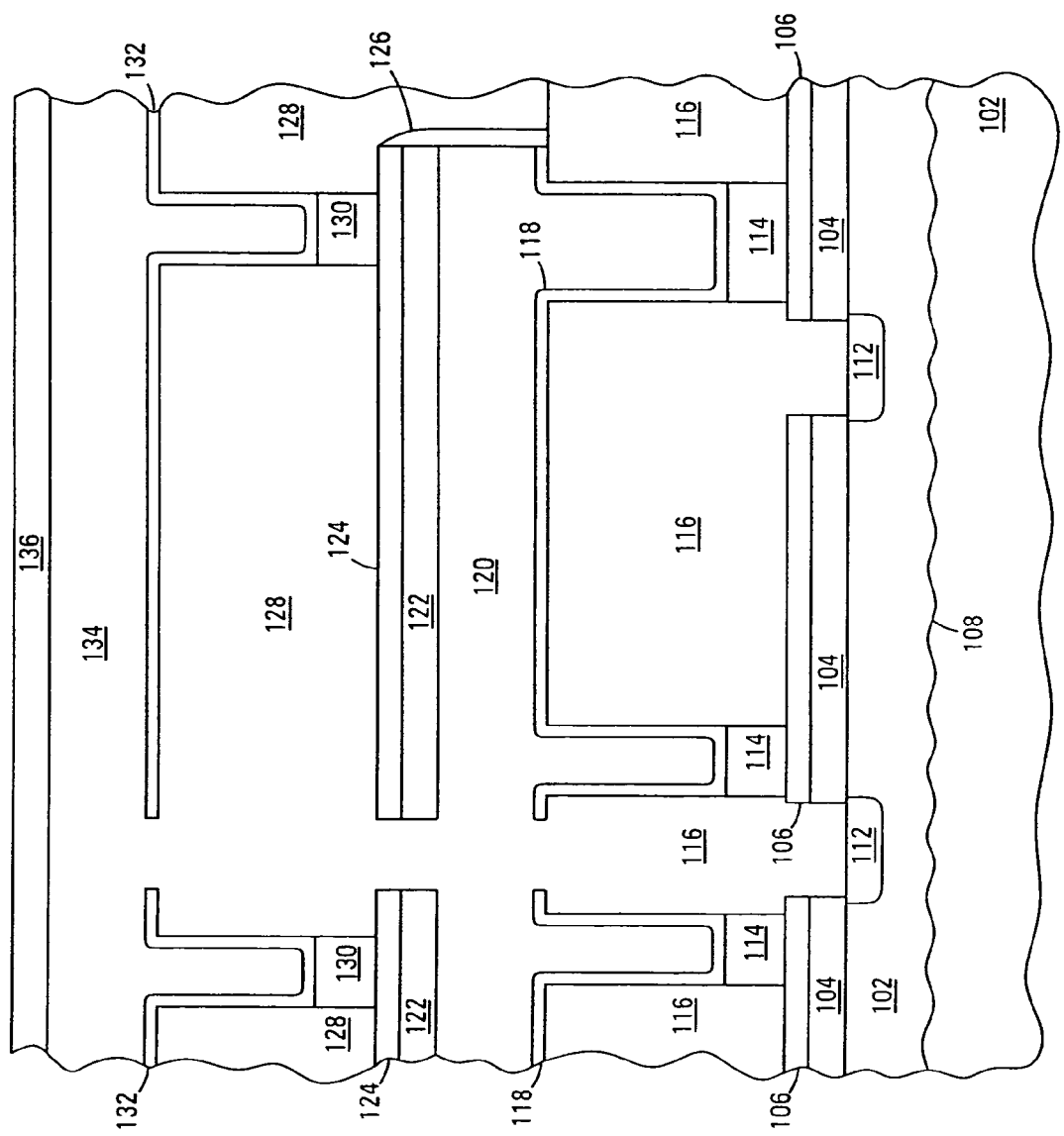

In FIG. 2C, the second sacrificial layer 131 is removed and the second capacitor dielectric layer 132 if formed as described with reference to FIGS. 1Q–1R. In FIG. 2D, a portion of the second capacitor dielectric layer 132 is removed to expose a portion of the third dielectric layer 128 as shown at 133. In FIG. 2E, the fourth conductive layer 134 and the insulative layer 136 are then formed as further described with reference to FIG. 1R. The fourth conductive layer 134 is thus in contact with the third conductive layer 128.

In FIG. 2F, the structure is cleaved and planarized as described with reference to FIGS. 1S–1T. The potential node is formed by making contact to each doped region, or cell plate junction, 112a. Using this potential node, a potential may be commonly applied to the cell plates 120 and 134 for all the memory cells of the array. Other methods may also be used to provide a common potential node, such as extending and contacting the cell plates 120 and 134 beyond the periphery of the memory array.

Figure 3:
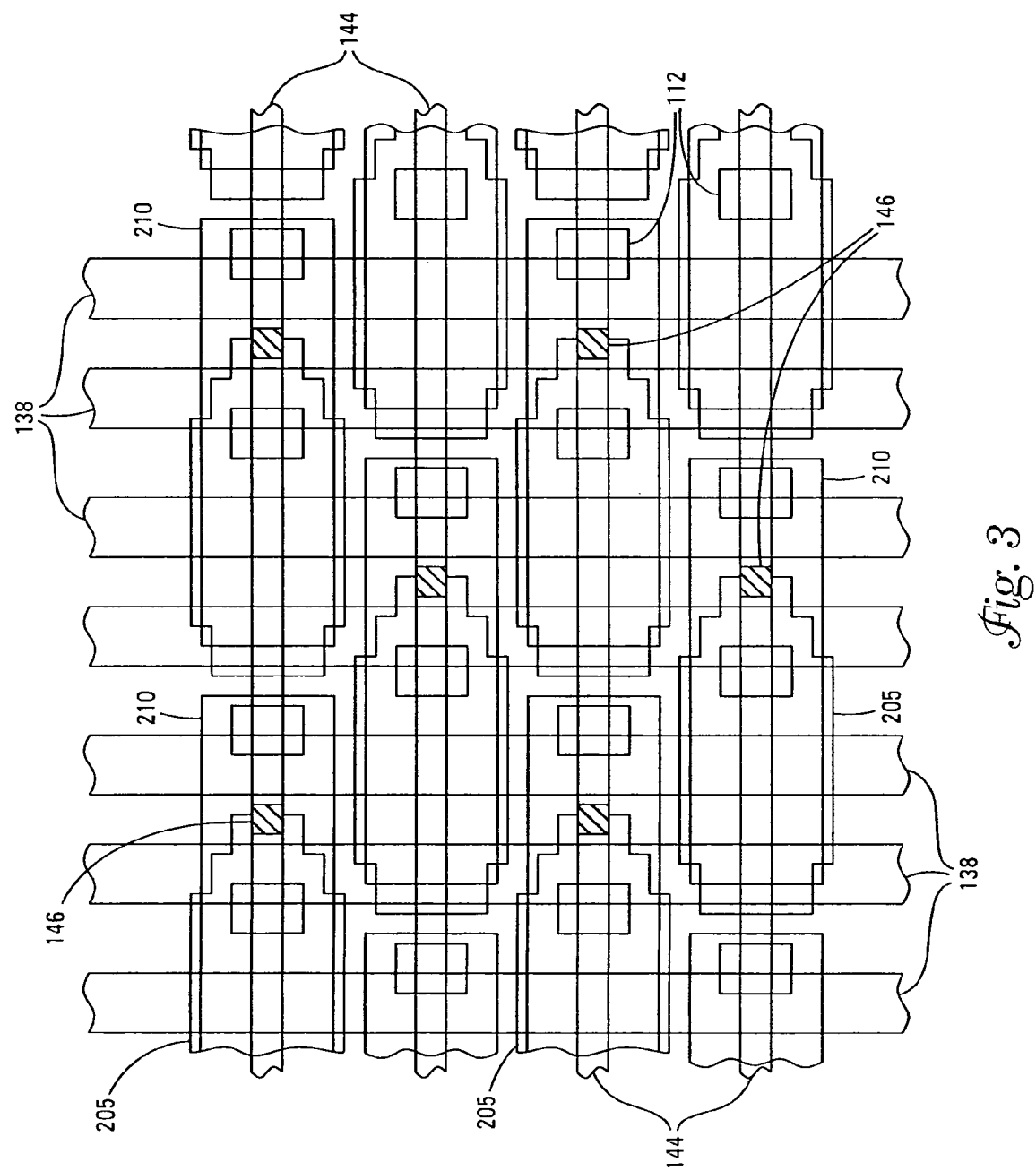
FIG. 3 is a top view of a memory array in accordance with one embodiment of the invention.

FIG. 3 is a top view of a memory array in accordance with one embodiment of the invention. A memory cell is formed at each intersection of a bit line 144 and a word line 138. A memory cell includes the access transistor of the word line 138 having a first source/drain region 112 coupled to a storage node of a cell capacitor and a second source/drain region (not shown in FIG. 3) coupled to a bit line 144 through a bit-line contact 146. A memory cell has a first source/drain region 112 coupled to a storage node of an upper cell capacitor 205 or a storage node of a lower cell capacitor 210. As shown in FIG. 3, the upper cell capacitors 205 and the lower cell capacitors 210 overlap, that is they share at least some of the die surface area. By forming one cell capacitor over another cell capacitor, the surface areas of both cell capacitors can be increased without increasing die surface area. This increase is relative to typical formation of cell capacitors placed in the same horizontal plane, but laterally spaced apart.

Figure 4:
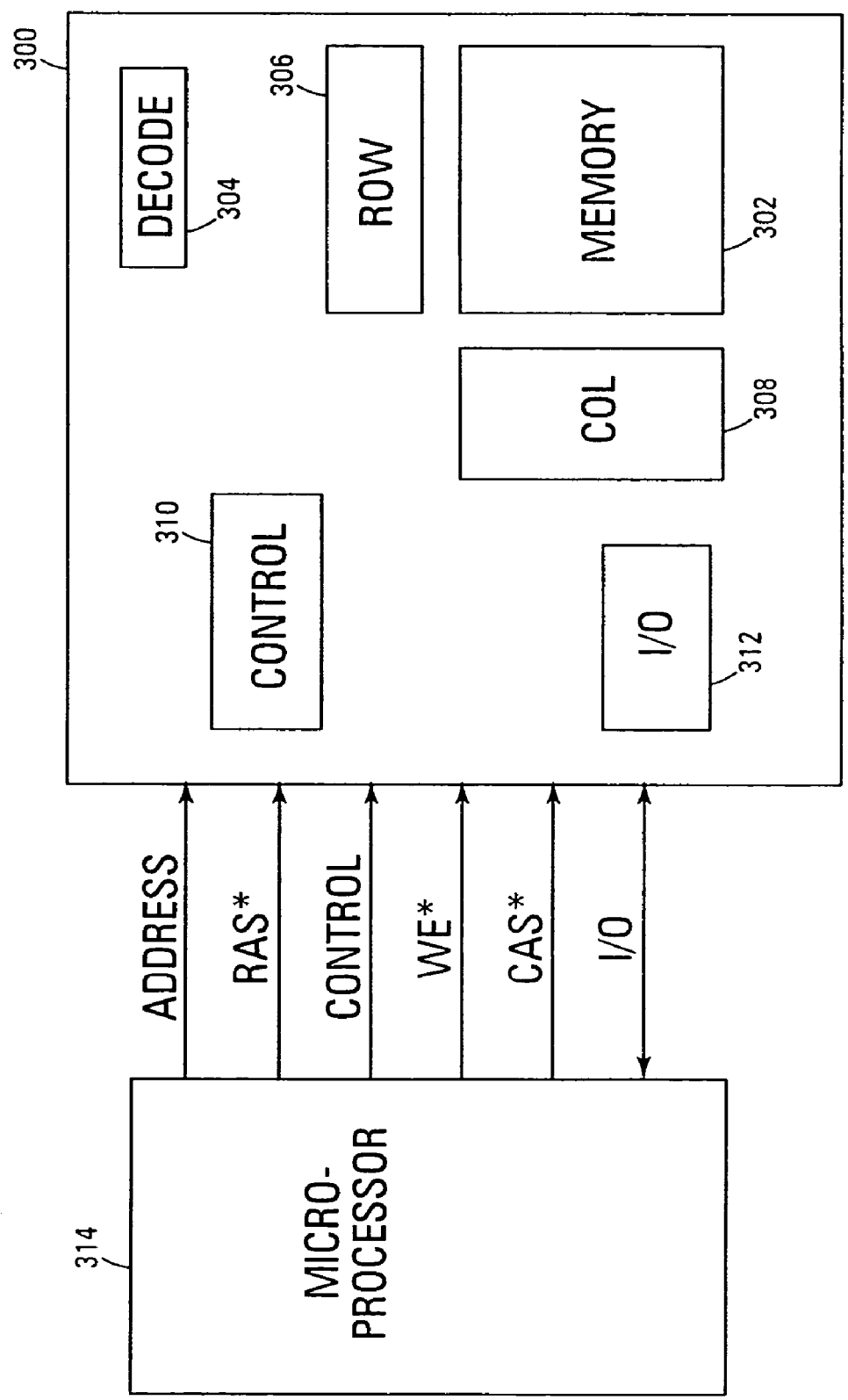
FIG. 4 is a simplified block diagram of an integrated circuit memory device as a dynamic memory device in accordance with an embodiment of the invention.

FIG. 4 is a simplified block diagram of an integrated circuit memory device as a dynamic memory device in accordance with an embodiment of the invention. The memory device 300 includes an array of memory cells 302, an address decoder 304, row access circuitry 306, column access circuitry 308, control circuitry 310, and Input/Output (I/O) circuitry 312. The memory device 300 can be coupled to an external microprocessor 314, or memory controller for memory accessing as part of an electronic system. The memory device 300 receives control signals from the processor 314, such as WE*, RAS* and CAS* signals. The memory cells are used to store data that are accessed via I/O lines. The memory cells are accessed in response to the control signals and the address signals. It will be appreciated by those skilled in the art that additional circuitry and control signals can be provided, and that the memory device of FIG. 4 has been simplified to help focus on the invention. The array of memory cells 302 includes at least one pair of memory cell capacitors in accordance with the invention.

It will be understood that the above description of a DRAM (Dynamic Random Access Memory) is intended to provide a general understanding of the memory and is not a complete description of all the elements and features of a DRAM. Further, the invention is equally applicable to a variety of sizes and types of memory circuits known in the art and is not intended to be limited to the DRAM described above.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

The foregoing figures were used to aid the understanding of the accompanying text. However, the figures are not drawn to scale and relative sizing of individual features and layers are not necessarily indicative of the relative dimensions of such individual features or layers in application. Accordingly, the drawings are not to be used for dimensional characterization.

CONCLUSION

Fabrication of memory cell capacitors in an over/under configuration facilitates increased capacitance values for a given die area. A pair of memory cells sharing a bit-line contact include a first capacitor below the substrate surface. The pair of memory cells further include a second capacitor such that at least a portion of the second capacitor is underlying the first capacitor. Such memory cell capacitors can thus have increased surface area for a given capacitor height versus memory cell capacitors formed strictly laterally adjacent one another. The memory cell capacitors can be fabricated using silicon-on-insulator (SOI) techniques. The memory cell capacitors are useful for a variety of memory arrays, memory devices and electronic systems.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. For example, other materials, shapes, deposition techniques and removal techniques may be utilized with the invention. Accordingly, this application is intended to cover any adaptations or variations of the invention. It is manifestly intended that this invention be limited only by the following claims and equivalents thereof.

What is claimed is:

1. A memory device, comprising:
a first memory cell including a first access transistor having a first source/drain region, a second source/drain region coupled to a first bit line of the memory device, and a gate coupled to a first word line of the memory device;
a second memory cell including a second access transistor having a first source/drain region, a second source/drain region coupled to the first bit line, and a gate coupled to a second word line of the memory device, wherein the second word line is different from the first word line;
wherein the first memory cell further includes a first cell capacitor coupled to the first source/drain region of the first access transistor through an extension;

wherein the second memory cell further includes a second cell capacitor having a storage node, the storage node and the extension of the first memory cell located side by side; and wherein the second source/drain region of the second access transistor is interposed between the first bit line and the storage node of the second cell capacitor.

2. The memory device of claim 1, wherein the second source/drain region of the first access transistor is shared with the second source/drain region of the second access transistor.

3. The memory device of claim 1, wherein the first and second source/drain regions are formed in an epitaxial silicon layer.

4. The memory device of claim 1, wherein the first cell capacitor is underlying at least a portion of the second cell capacitor.

5. The memory device of claim 1, wherein the cell capacitors each have a capacitor dielectric layer comprising a dielectric material selected from the group consisting of silicon oxides, silicon nitrides and silicon oxynitrides.

6. The memory device of claim 1, wherein the cell capacitors each have a capacitor dielectric layer comprising a dielectric material selected from the group consisting of $Ba_zSr_{(1-z)}TiO_3$[BST; where 0<z<1], $BaTiO_3$, $SrTiO_3$, $PbTiO_3$, Pb $(Zr,Ti)O_3$[PZT], (Pb,La)(Zr,Ti)$O_3$[PLZT], (Pb,La)$TiO_3$[PLT], $Ta_2O_5$, $KNO_3$, $Al_2O_3$ and $LiNbO_3$.

7. A memory device, comprising:
a plurality of bit lines;
a plurality of word lines;
an array of memory cells, wherein the array of memory cells comprises:
a first memory cell including a first access transistor having a first source/drain region, a second source/drain region coupled to a first bit line of the plurality of bit lines, and a gate coupled to a first word line of the plurality of word lines;
a second memory cell including a second access transistor having a first source/drain region, a second source/drain region coupled to the first bit line, and a gate coupled to a second word line of the plurality of word lines different from the first word line;
wherein the first memory cell further includes a first cell capacitor coupled to the first source/drain region of the first access transistor through an extension;
wherein the second memory cell further includes a second cell capacitor having a storage node, the storage node and the extension of the first memory cell located side by side; and
wherein the second source/drain region of the second access transistor is interposed between the first bit line and the storage node of the second cell capacitor.

8. The memory device of claim 7, wherein the second cell capacitor is underlying the second source/drain regions of the first and second memory cells.

9. The memory device of claim 8, wherein at least a portion of the first cell capacitor is underlying a portion of the second cell capacitor.

10. A memory device, comprising:
a plurality of bit lines;
a plurality of word lines;
an array of memory cells, wherein the array of memory cells comprises:
a first memory cell including a first access transistor having a first source/drain region, a second source/drain region coupled to a first bit line of the plurality of bit lines, and a gate coupled to a first word line of the plurality of word lines;
a second memory cell including a second access transistor having a first source/drain region, a second source/drain region coupled to the first bit line, and a gate coupled to a second word line of the plurality of word lines different from the first word line;
wherein the first memory cell further includes a cell capacitor coupled to the first source/drain region of the first access transistor through an extension;
wherein the second memory cell further includes a cell capacitor interposed between the second access transistor and the cell capacitor of the first memory cell;
wherein the cell capacitor of the first memory cell and the cell capacitor of the second memory cell each share surface area of a die containing the memory device; and
wherein the second source/drain region of the second access transistor is interposed between the first bit line and a storage node of the second cell capacitor.

11. The memory device of claim 10, wherein the second source/drain region of the first access transistor is shared with the second source/drain region of the second access transistor.

12. A memory cell, comprising:
an access transistor having a first source/drain region and a second source/drain region, wherein the second source/drain region is coupled to a bit line; and
a container capacitor coupled to the first source/drain region of the access transistor through an extension;
wherein the extension is located side by side with a storage node of a second container capacitor of a second memory cell; and
wherein the second source/drain region is interposed between the bit line and the storage node of the second container capacitor.

13. The memory cell of claim 12, wherein the container capacitor of the memory cell is underlying at least a portion of the second container capacitor of the second memory cell.

14. The memory cell of claim 12, wherein the second memory cell has an access transistor having a source/drain region coupled to the bit line.

15. The memory cell of claim 14, wherein the source/drain region of the access transistor of the second memory cell that is coupled to the bit line is shared with the second source/drain region of the memory cell.

16. The memory cell of claim 12, wherein the container capacitor of the second memory cell is underlying both the first and second source/drain regions of the access transistor of the memory cell.

17. A memory device, comprising:
a plurality of bit lines;
a plurality of word lines;
an array of memory cells, wherein the array of memory cells comprises:
a first memory cell including a first access transistor having a first source/drain region, a second source/drain region coupled to a first bit line of the plurality of bit lines, and a gate coupled to a first word line of the plurality of word lines;
a second memory cell including a second access transistor having a first source/drain region, a second source/drain region coupled to the first bit line, and a gate coupled to a second word line of the plurality of word lines different from the first word line;

wherein the first memory cell further includes a first container capacitor coupled to the first source/drain region of the first access transistor through an extension;

wherein the second memory cell further includes a second container capacitor having a storage node, the storage node and the extension of the first memory cell located side by side; and wherein the second source/drain region of the second access transistor is interposed between the first bit line and the storage node of the second container capacitor.

18. The memory device of claim 17, wherein the first container capacitor is underlying at least a portion of the second container capacitor.

19. The memory device of claim 17, wherein second source/drain region of the second access transistor that is coupled to the first bit line is shared with the second source/drain region of the first memory cell.

20. The memory device of claim 17, wherein the second container capacitor is underlying both the first and second source/drain regions of the access transistor of the first memory cell.

21. The memory device of claim 17, wherein the first and second container capacitors each share surface area of a die containing the memory device.

22. A memory device, comprising:
a first memory cell including a first access transistor having a first source/drain region, a second source/drain region coupled to a first bit line of the memory device, and a gate coupled to a first word line of the memory device;

a second memory cell including a second access transistor having a first source/drain region, a second source/drain region coupled to the first bit line, and a gate coupled to a second word line of the memory device, wherein the second word line is different from the first word line;

wherein the first memory cell further includes a first cell capacitor coupled to the first source/drain region of the first access transistor through an extension;

wherein the second memory cell further includes a second cell capacitor having a storage nodo; and wherein the second source/drain region of the second access transistor is interposed between the first bit line and the storage node of the second cell capacitor.

23. The memory device of claim 22, wherein the second source/drain region of the first access transistor is shared with the second source/drain region of the second access transistor.

24. The memory device of claim 22, wherein the first cell capacitor is underlying at least a portion of the second cell capacitor.

25. A memory cell, comprising:
an access transistor having a first source/drain region and a second source/drain region, wherein the second source/drain region is coupled to a bit line; and a container capacitor coupled to the first source/drain region of the access transistor through an extension;

wherein the extension is located in the same plane as a storage node of a second container capacitor of a second memory cell; and wherein the second source/drain region of the second access transistor is interposed between the first bit line and the storage node of the second container capacitor.

26. The memory cell of claim 25, wherein the container capacitor of the memory cell is underlying at least a portion of the second container capacitor of the second memory cell.

27. The memory cell of claim 25, wherein the second memory cell has an access transistor having a source/drain region coupled to the bit line.

28. The memory cell of claim 27, wherein the source/drain region of the access transistor of the second memory cell that is coupled to the bit line is shared with the second source/drain region of the memory cell.

29. The memory cell of claim 25, wherein the container capacitor of the second memory cell is underlying both the first and second source/drain regions of the access transistor of the memory cell.

30. A memory device, comprising:
a plurality of bit lines;
a plurality of word lines;
an array of memory cells, wherein the array of memory cells comprises:
a first memory cell including a first access transistor having a first source/drain region, a second source/drain region coupled to a first bit line of the plurality of bit lines, and a gate coupled to a first word line of the plurality of word lines;

a second memory cell including a second access transistor having a first source/drain region, a second source/drain region coupled to the first bit line, and a gate coupled to a second word line of the plurality of word lines different from the first word line;

wherein the first memory cell further includes a first cell capacitor coupled to the first source/drain region of the first access transistor through an extension;

wherein the second memory cell further includes a second cell capacitor having a storage node; and wherein the second source/drain region of the second access transistor is interposed between the first bit line and the storage node of the second cell capacitor.

31. The memory device of claim 30, wherein the second cell capacitor is underlying the second source/drain regions of the first and second memory cells.

32. The memory device of claim 31, wherein at least a portion of the first cell capacitor is underlying a portion of the second cell capacitor.

* * * * *

UNITED STATES PATENT AND TRADEMARK OFFICE
CERTIFICATE OF CORRECTION

PATENT NO. : 7,202,519 B2 Page 1 of 1
APPLICATION NO. : 10/870811
DATED : April 10, 2007
INVENTOR(S) : Fernando Gonzalez It is certified that error appears in the above-identified patent and that said Letters Patent is hereby corrected as shown below:

Column 7, line 31, erroneous space insertion, replace "Pb(Zr,Ti) $O_3$[PZT]" with --Pb(Zr,Ti)$O_3$[PZT]--.
Column 15, line 43, replace "nodo" with --node--.

Signed and Sealed this

Twenty-seventh Day of November, 2007

JON W. DUDAS
*Director of the United States Patent and Trademark Office*